US011570849B2

(12) United States Patent
Bertolina et al.

(10) Patent No.: US 11,570,849 B2
(45) Date of Patent: Jan. 31, 2023

(54) WIRELESS INSTRUMENT AREA NETWORK NODE WITH INTERNAL FORCE SENSOR

(71) Applicant: Schneider Electric Systems USA, Inc., Foxborough, MA (US)

(72) Inventors: Mark V. Bertolina, Milton, MA (US); Philip George Hunt, Bedford, MA (US)

(73) Assignee: Schneider Electric Systems USA, Inc., Foxborough, MA (US)

( * ) Notice: Subject to any disclaimer, the term of this patent is extended or adjusted under 35 U.S.C. 154(b) by 88 days.

(21) Appl. No.: 17/003,960

(22) Filed: Aug. 26, 2020

(65) Prior Publication Data

US 2020/0396795 A1 Dec. 17, 2020

Related U.S. Application Data

(63) Continuation-in-part of application No. 16/705,843, filed on Dec. 6, 2019.
(Continued)

(51) Int. Cl.
*H04W 88/08* (2009.01)
*H04W 4/38* (2018.01)
(Continued)

(52) U.S. Cl.
CPC ........ *H04W 88/085* (2013.01); *G06F 1/3206* (2013.01); *G06F 1/3262* (2013.01);
(Continued)

(58) Field of Classification Search
CPC ..... H04W 88/085; H04W 4/38; G06F 1/3206; G06F 1/3262; G06F 1/3265; H01Q 1/3233; H03K 19/018521
See application file for complete search history.

(56) References Cited

U.S. PATENT DOCUMENTS 4,181,015 A * 1/1980 Jensen .................. G01B 5/207
73/159
5,224,362 A * 7/1993 Sawazaki ............... D04B 35/10
242/573
(Continued)

FOREIGN PATENT DOCUMENTS

CN 103218070 B 3/2016

OTHER PUBLICATIONS

EP Extended Search Report for European Patent Application No. 21192620.9 dated Jan. 24, 2022.

*Primary Examiner* — Dominic E Rego
(74) *Attorney, Agent, or Firm* — Locke Lord LLP

(57) ABSTRACT

A wireless instrument area network node employs an internal force sensor arrangement to detect user-provided force on the node and initiate a node operation, such as wake the node from a sleep state or low power mode to a more power-hungry awake and processing state. The internal force sensor avoids the need to provide external buttons, a screen, and the like on the surface of the node that could lead to intrusion of fluids, gases, or other unwanted substances into the node. In some embodiments, the internal sensor may include a microswitch that has sufficient sensitivity to detect even a very small amount of deflection resulting from, for example, a hand touch. In some embodiments, the internal sensor may include a piezoelectric sensor that has similarly high deflection sensitivity. Multiple such deflection detectors may be at different angles to one another deployed to provide greater directional coverage for the deflection.

20 Claims, 16 Drawing Sheets

Related U.S. Application Data

(60) Provisional application No. 62/944,780, filed on Dec. 6, 2019, provisional application No. 62/776,284, filed on Dec. 6, 2018.

(51) Int. Cl.
  *G06F 1/3206* (2019.01)
  *H01Q 1/32* (2006.01)
  *G06F 1/3234* (2019.01)
  *H03K 19/0185* (2006.01)

(52) U.S. Cl.
  CPC ......... *G06F 1/3265* (2013.01); *H01Q 1/3233* (2013.01); *H03K 19/018521* (2013.01); *H04W 4/38* (2018.02)

(56) References Cited

U.S. PATENT DOCUMENTS

| | | | |
|---|---|---|---|
| 7,731,297 B1 * | 6/2010 | Ozanich | B60P 1/26 |
| | | | 298/7 |
| 9,435,708 B1 * | 9/2016 | Kari | G01L 25/003 |
| 9,552,049 B1 * | 1/2017 | Butler | G06F 1/1684 |
| 10,055,048 B2 | 8/2018 | Smith | |
| 10,680,886 B1 | 6/2020 | Hunt et al. | |
| 10,840,735 B1 * | 11/2020 | Cooper | H02J 13/00004 |
| 2002/0124957 A1 * | 9/2002 | Hofmann | B24B 49/16 |
| | | | 156/345.12 |
| 2007/0212129 A1 * | 9/2007 | Takemoto | G03G 15/161 |
| | | | 399/313 |
| 2010/0277431 A1 | 11/2010 | Klinghult | |
| 2010/0289759 A1 * | 11/2010 | Fisher | G06F 3/044 |
| | | | 345/173 |
| 2013/0257956 A1 * | 10/2013 | de Jong | B41J 11/0095 |
| | | | 347/16 |
| 2015/0332702 A1 * | 11/2015 | Disch | G10L 19/20 |
| | | | 704/500 |
| 2018/0065521 A1 * | 3/2018 | Vela | B60N 2/0228 |
| 2018/0129335 A1 * | 5/2018 | Stone | G06F 3/04162 |
| 2018/0129336 A1 * | 5/2018 | Files | G06F 3/0442 |
| 2018/0132659 A1 * | 5/2018 | Morgan | A47J 37/0704 |
| 2019/0368959 A1 * | 12/2019 | Brucker | H01J 41/06 |
| 2020/0183378 A1 | 6/2020 | Bertolina et al. | |
| 2020/0396795 A1 * | 12/2020 | Bertolina | H01Q 1/3233 |

\* cited by examiner

WIRELESS INSTRUMENT AREA NETWORK NODE WITH INTERNAL FORCE SENSOR

CROSS REFERENCE TO RELATED APPLICATION

This application claims the benefit of and priority to U.S. Provisional Application No. 62/944,780, filed on Dec. 6, 2019 under 35 U.S.C. § 119(e), and is a continuation-in-part of U.S. application Ser. No. 16/705,843, filed on Dec. 6, 2019, which claims the benefit of and priority to U.S. Provisional Application No. 62/776,284, filed on Dec. 6, 2018 under 35 U.S.C. § 119(e), all of which are incorporated by reference herein in their entirety.

FIELD

This disclosure relates generally to industrial equipment, and more particularly, to systems and methods related to automatically collecting and analyzing data from industrial equipment.

BACKGROUND

As is known, an industrial operation typically includes a plurality of industrial equipment. The industrial equipment can come in a variety of forms and may be of varying complexities, for example, depending on the industrial operation. Additionally, in some instances the industrial equipment may be installed or located in a multitude of locations (e.g., facilities or geographical locations). Data collected from the industrial equipment may be processed by monitoring and collection sites, for example, which are generally significant distances from the locations in which the industrial equipment are installed. For example, wireless sensor networks (WSNs) may collect data from the industrial equipment in each of the respective locations in which the industrial equipment is installed, and transmit the collected data over the long haul (e.g., communications networks spanning many miles) back to the monitoring and collection sites for processing.

The advantages of WSNs are well understood by many operators of industrial operations, although the cost of transmission for the wirelessly collected data over the long haul back to the monitoring and collection sites may still prove prohibitive and prevent such deployments from returning on the investment as intended. For example, in some instances the locations in which the industrial equipment is installed are remote locations which do not possess (or possess very limited) cellular (and other forms of data) reception. In these remote locations, significant costs must be expended to build suitable communications networks (e.g., cell phone networks, telephone networks, etc.) to enable transmission of industrial equipment data. Often data collection locally has low operational expense (aka opex) as there is no need of a third party long haul provider (who has large infrastructure costs they want to recover from building communications networks). It is the combined cost of sensors and backhaul together that make the decision to deploy difficult. Operators of wells might for instance like having sensors report to a base radio and be collected together locally as this only needs a onetime capex (capital expense) expenditure, but they may dislike having monthly opex for any technology needed for that data to be returned to them for centralization. Additionally, if they already deploy human visitors to industrial equipment sites or locations, they further see this opex cost for backhaul as unnecessary as they can instead have their staff collect the data manually.

SUMMARY

Described herein are systems and methods related to automatically collecting and analyzing data from industrial equipment, for example, to reduce costs and increase efficiencies associated with collecting and processing the data and taking actions (e.g., performing maintenance) in response to the data. The industrial equipment may be installed or located, for example, in a facility or facilities including a plurality of industrial equipment. Additionally, the industrial equipment may be installed or located on a site or sites (i.e., not necessarily a facility) including a plurality of industrial equipment.

In one aspect, a method for automatically collecting and analyzing data from a plurality of industrial equipment includes automatically establishing communication between sensor nodes of the plurality of equipment and a "walk-in device", for example, in response to the walk-in device entering a data collection area (or areas) associated with the plurality of electrical equipment. The data collection area(s) may be located, for example, in a facility, facilities, or site(s) in which the plurality of industrial equipment are installed. In embodiments, the communication is established using Bluetooth (such as low energy Bluetooth), WiFi, Zigbee, or another communication protocol, for example.

The method also includes determining if the walk-in device is an authorized device to collect data from the plurality of industrial equipment and, in response to determining the walk-in device is an authorized device, automatically collecting select data from the plurality of industrial equipment on the walk-in device. The collected data may be processed, for example, to determine if maintenance (e.g., software updates, calibration) needs to be, or is recommended to be, performed on one or more of the plurality of industrial equipment. In response to determining maintenance needs or recommendations for one or more of the plurality of industrial equipment, for example, it may be determined if the walk-in device is capable of performing the maintenance. In response to determining the walk-in device is capable of performing the maintenance (e.g., installing software updates or performing calibration), the maintenance may be performed on the equipment using the walk-in device. Additionally, in response to determining the walk-in device is incapable of performing the maintenance, the maintenance needs or recommendations may be communicated, for example, through at least one of: a report, a text, an email, audibly, and an interface of a screen/display.

It is understood that the collected data may be processed for many other purposes. For example, the collected data may be processed to identify issues with one or more of the plurality of industrial equipment. In response to identifying issues with one or more of the plurality of industrial equipment, it may be determined if the walk-in device is capable of addressing the issues or if additional help is needed (e.g., from a system operator). In response to determining the walk-in device is capable of addressing the issues (e.g., by adjusting one or more parameters associated with the equipment), the issues may be addressed using the walk-in device. Additionally, in response to determining the walk-in device is incapable of addressing the issues, the issues may be communicated, for example, through at least one of: a report, a text, an email, audibly, and an interface of a screen/display.

In accordance with some embodiments of this disclosure, the collected data is processed on the walk-in device. Additionally, in accordance with some embodiments of this disclosure, the collected data may be processed by uploading the collected data from the walk-in device to a central computing device (e.g., Edge gateway or other cloud computing device), and processing the collected data on the central computing device. In some embodiments, the collected data may be uploaded from the walk-in device to the central computing device in response to the walk-in device entering the data collection area(s) and/or data upload area(s), for example, in the facility, facilities or site(s) in which the industrial equipment is located. The data upload area(s) may correspond, for example, to specific area(s) in the facility, facilities or site(s) for uploading the collected data. In other embodiments, the collected data may be uploaded in response to a button push or other interaction or gesture by a system operator, for example, in the data collection area(s), data upload area(s) or another area. In some embodiments, the data collection area(s) and/or data upload area(s) may include a base station (e.g., a docking station) that the walk-in device is capable of being communicatively coupled to (e.g., wirelessly or wired). The walk-in device may be configured to provide the collected data to the base station, for example, for uploading to the central computing device.

In accordance with some embodiments of this disclosure, the walk-in device is configured to enter the data collection area(s) and/or the data upload area(s) (which may be one in the same in some embodiments) after a predetermined time period, and/or in response to one or more predetermined conditions. For example, the walk-in device may be configured or programmed to enter the data collection area(s) at select times during the day, week, month, etc., for example, based known uptime or downtime of the industrial equipment associated with the data collection area(s). As another example, the walk-in device may enter the data collection area(s) in response to an event (or events) occurring in the facility, facilities or site(s) associated with the industrial equipment, such as a power outage that may impact operation of the industrial equipment. It is understood that the walk-in device may enter the data collection area(s) and/or the data upload area(s) in response to many other conditions (predetermined or otherwise).

A walk-in device in accordance with embodiments of this disclosure can include, for example, a processor and a memory with computer code instructions stored thereon, for example, to enable automatic collection and analysis of data from industrial equipment. In some embodiments, the walk-in device may take the form of a mobile device, for example, a device that may be carried by a system user, operator or maintenance personnel. Additionally, in some embodiments the walk-in device may take the form of, or be integrated with, a robot, wheeled cart or vehicle, unmanned aerial vehicle (such as a drone) or similar device capable of navigating an industrial facility or operation. The device (e.g., the robot or unmanned aerial vehicle) may be an autonomous device in some embodiments.

The walk-in device can include or be coupled to one or more input/output devices, for example, to facilitate user interaction (e.g., to display a facility map, to enable a user to make a selection of an area or equipment on the facility map). As one example, the walk-in device can include an interactive touch screen input interface that accepts gestures as input. As another example, the walk-in device can be coupled to a keyboard.

The walk-in device can also include or be coupled to one or more sensors, for example, for observing a facility, facilities or site(s) associated with the industrial equipment. For example, in one embodiment the walk-in device may include one or more image capture devices (e.g., cameras) capable of scanning or capturing one or more areas in a facility. In accordance with some embodiments, information may be extracted from images captured and provided to a system user, operator or maintenance personnel, for example, using augmented reality (AR) technology. For example, the information extracted from the images captured may include alerts and alarms related to industrial equipment and be provided to the system user, operator or maintenance personnel in the form of an overlay on the image capture, for example, on a display device viewed by the system user, operator or maintenance personnel. The display device may include a display of the walk-in device (when provided with a display) and/or a display of another computing device accessible by the system user, operator or maintenance personnel, for example, a desktop computer, a laptop computer, a handheld computer, a tablet computer, a smart phone, and/or the like.

This video augmentation approach can add valuable and easy-to-use new data forms and new highly informative representations of that data. For instance, a sensor could arrange for its value (say when in alarm) to paint a message in red (and green when not) over the area it is sampling when such an area comes into view from the tablet camera on the tablet screen. This is known as "augmented reality"—where the readings are preferably portrayed over the actual image of the real instrument in the location as viewed live through the camera and screen combination of the walk-in device (e.g., tablet). The sensors need only know their own location and report that to the walk-in device, which we have already allowed for in the design of sensors provided in products by Schneider Electric, for example. The walk-in device knows its own location, and from commonly deployed internal sensors all the angles of presentation of the camera (e.g. the compass heading, tilt, etc.). From this basic data, the walk-in device constructs the Virtual Reality image of that scene's actual image, say a well head or other process, with the relevant data overlaid on the same screen, as if "floating" over the relevant device or point.

Further described herein are systems and methods related to a wireless instrument area network node that uses an internal force sensor arrangement to detect user-provided force on the node. The user provided force, when detected, initiates one or more predefined node operations, such as wake the node from a sleep state or low power mode to a more power-hungry awake and processing state. The internal force sensor avoids the need to provide external buttons, a screen, and the like on the surface of the node that could lead to intrusion of fluids, gases, or other unwanted substances into the node. In some embodiments, the internal sensor may include a microswitch that has sufficient sensitivity to detect even a very small amount of deflection resulting from, for example, a hand touch. In some embodiments, the internal sensor may include a piezoelectric sensor that has similarly high deflection sensitivity. Multiple such deflection detectors may be deployed at different angles to one another to provide greater directional coverage for the deflection.

In some aspects, embodiments of the present disclosure relate to wireless instrument area network node. The wireless instrument area network node comprises, among other things, a cover and a base plate fastened to the cover, the base plate and the cover forming a housing for the node. The cover may be a dome-shaped cover and/or the housing may be fluid tight and gas tight housing. The wireless instrument area network node further comprises node control circuitry attached to the base plate within the housing, the node control circuitry operable to control operation of the node, and a deflection detector on the base plate within the housing, the deflection detector configured to provide an input to the node control circuitry in response to a user-provided force being applied to the housing. The node performs a predefined node operation in response to the node control circuitry receiving an input from the deflection detector.

In some aspects, embodiments of the present disclosure relate to a method of operating a wireless instrument area network node. The method comprises, among other things, receiving a user-provided force applied to a housing of the node, the housing comprising a cover fastened to a base plate, the base plate and the cover forming an enclosure for the node. The cover may be a dome-shaped cover and/or the enclosure may be fluid tight and gas tight enclosure. The method also comprises detecting a deflection in the base plate resulting from the user-provided force, the deflection in the base plate being detected by a deflection detector on the base plate within the housing. The method further comprises providing an input from the deflection detector to node control circuitry attached to the base plate within the housing in response to detection of the deflection in base plate by the deflection detector, the node control circuitry operable to control operation of the node. A predefined node operation is performed in the node in response to the node control circuitry receiving an input from the deflection detector.

In accordance with any one or more of the foregoing embodiments, the predefined node operation includes one or more of: waking up the node from a sleep mode, initiating a data transfer to or from the node, connecting the node to a group of nodes, allowing other devices to connect to the node, and turning on or flashing an LED in the node. In accordance with any one or more of the foregoing embodiments, the node control circuitry is further operable to apply hysteresis to the input received from the deflection detector to minimize inadvertent inputs from the deflection detector.

In accordance with any one or more of the foregoing embodiments, the user-provided force includes a hand touch, the base plate is made of a stainless steel material, and/or the deflection detector is a microswitch detection deflector. In accordance with any one or more of the foregoing embodiments, a mounting platform is attached to the base plate, wherein the microswitch detection deflector is secured to the mounting platform, and/or wherein the mounting platform has a mounting slot formed therein having a size and shape to receive the microswitch detection deflector.

In accordance with any one or more of the foregoing embodiments, the deflection detector is a piezoelectric detection deflector, and/or wherein the node control circuitry causes the node to initiate a different predefined node operation according to an amplitude of an input received from the piezoelectric detection deflector.

It is understood that there are many additional advantages and aspects associated with the disclosed systems and methods, as will be further appreciated from the discussions below.

BRIEF DESCRIPTION OF THE DRAWINGS

The foregoing features of the disclosure, as well as the disclosure itself may be more fully understood from the following detailed description of the drawings, in which.

DETAILED DESCRIPTION

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected.

Figure 1:
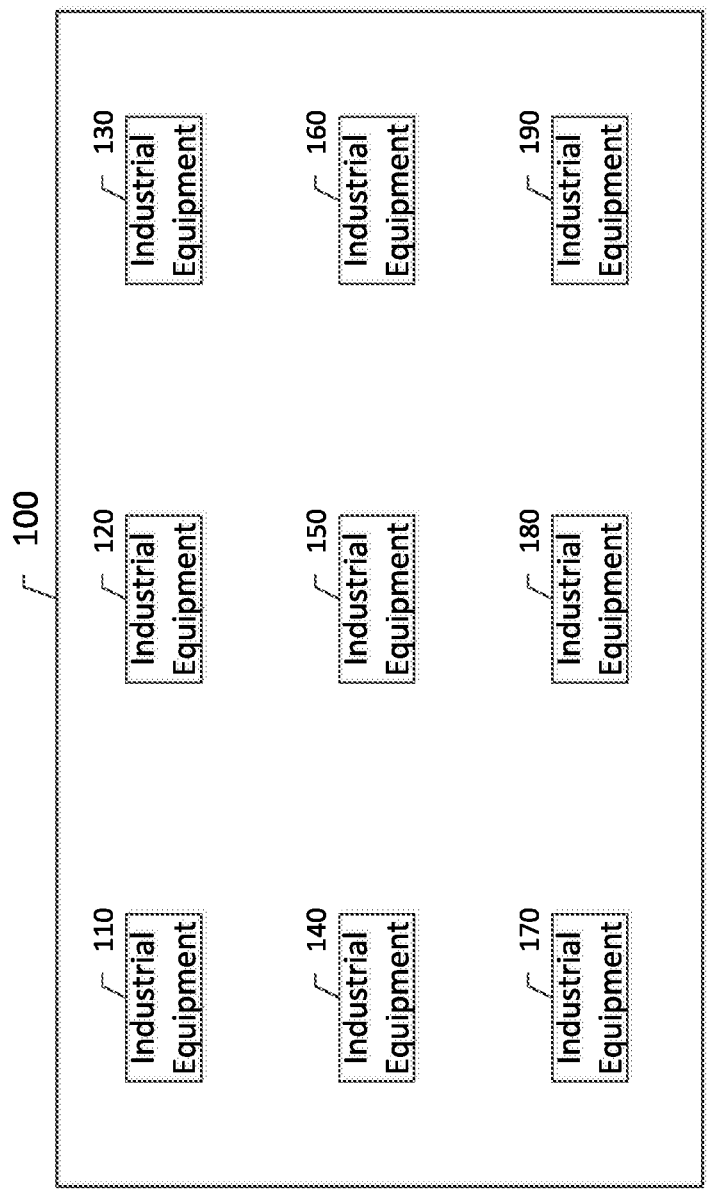
FIG. 1 shows an example industrial system in accordance with embodiments of the disclosure.

Referring to FIG. 1, an industrial system 100 in accordance with embodiments of the disclosure includes a plurality of industrial equipment 110, 120, 130, 140, 150, 160, 170, 180, 190. The industrial equipment (or devices) 110, 120, 130, 140, 150, 160, 170, 180, 190 may be associated with a particular application (e.g., an industrial application), applications, and/or process(es). The industrial equipment 110, 120, 130, 140, 150, 160, 170, 180, 190 may include electrical or electronic equipment, for example, such as machinery (e.g., pumps, metering devices) in an industrial operation (e.g., a manufacturing or natural resource extraction operation). The industrial equipment 110, 120, 130, 140, 150, 160, 170, 180, 190 may also include the controls and/or ancillary equipment associated with the industrial equipment 110, 120, 130, 140, 150, 160, 170, 180, 190, for example, Instruct Area Network (IAN) devices by Schneider Electric. In embodiments, the industrial equipment 110, 120, 130, 140, 150, 160, 170, 180, 190 may be installed or located in one or more facilities (i.e., buildings) or other physical locations (i.e., sites) associated with an industrial operation. The facilities may correspond, for example, to industrial buildings. Additionally, the physical locations may correspond, for example, to geographical areas or locations.

The industrial equipment 110, 120, 130, 140, 150, 160, 170, 180, 190 may each include or be coupled to one or more sensors (or sensor nodes) in some embodiments. Each of the sensors (e.g., 111, shown in FIG. 1A, as will be discussed further below) may be configured to sample, sense or monitor one or more parameters (e.g., industrial parameters) associated with the industrial equipment 110, 120, 130, 140, 150, 160, 170, 180, 190 and/or the application(s) or process(es) associated with the industrial equipment 110, 120, 130, 140, 150, 160, 170, 180, 190. For example, industrial equipment 110 may include or be coupled to a temperature sensor configured to sense temperature(s) associated with the industrial equipment 110, for example, ambient temperature proximate to the industrial equipment 110, temperature of a process associated with the industrial equipment 110, temperature of a product produced by the industrial equipment 110, etc. The industrial equipment 110 may additionally or alternatively include one or more pressure sensors, flow sensors, vibration sensors and/or any number of other sensors, for example, associated the application(s) or process(es) associated with the industrial equipment 110.

The industrial equipment 110, 120, 130, 140, 150, 160, 170, 180, 190 may take various forms and may each have an associated complexity (or set of functional capabilities and/or features), and this may determine the type and number of sensor(s) in or associated with the industrial equipment 110, 120, 130, 140, 150, 160, 170, 180, 190, for example. For example, industrial equipment 110 may correspond to a "basic" industrial equipment, industrial equipment 120 may correspond to an "intermediate" industrial equipment, and industrial equipment 130 may correspond to an "advanced" industrial equipment. In such embodiments, intermediate industrial equipment 120 may have more functionality (e.g., measurement features and/or capabilities) than basic industrial equipment 110, and advanced industrial equipment 130 may have more functionality and/or features than intermediate industrial equipment 120. For example, in embodiments industrial equipment 110 (e.g., industrial equipment with basic capabilities and/or features) may be capable of monitoring one or more first characteristics of an industrial process, and industrial equipment 130 (e.g., industrial equipment with advanced capabilities) may be capable of monitoring one or more second characteristics of the industrial process, with the second characteristics including the first characteristics and one or more additional parameters. It is understood that this example is for illustrative purposes only, and likewise in some embodiments the industrial equipment 110, 120, 130, etc. may each have independent functionality.

As discussed in the Background section of this disclosure, data collected from industrial equipment (such as industrial equipment 110, 120, 130, 140, 150, 160, 170, 180, 190) is generally processed by monitoring and collection sites which are significant distances from the locations in which the industrial equipment are installed. For example, wireless sensor networks (WSNs) may be installed in the locations (i.e., facilities or sites), collect data from the industrial equipment, and transmit the collected data over the long haul (e.g., communications networks spanning many miles) back to the monitoring and collection sites for processing. As is understood, the costs associated with installing the WSNs and transmitting the collected data over the long haul using a third party long haul provider (which has large infrastructure costs they want to recover) can be very high, and even be cost prohibitive for some industrial operations (i.e., preventing them from adopting the general approach).

This uneconomic situation arises because of a number of factors. For example, sometimes simply there is no low cost sensor for the particular application (especially true if in hazardous areas)—particularly in upstream in oil and gas (O&G) wells where monitoring of low flow rates of injected chemicals is hard to do economically simply due to the difficulty in measurement of such low flows and therefore is very costly. Additionally, in some instances there is no available infrastructure to off-load/backhaul the wireless data from any concentrator or base radio onwards to centralized collection, storage, and analysis. Building out an infrastructure may be significantly prohibitive for many industrial operations. Further, even when the data is backhauled, the opex costs might be prohibitive (and have on-going costs like cellular and/or satellite monthly rates). The potential client may already have people physically visiting the site periodically and therefore they can ascertain the core functions or state of the application relatively cheaply and flexibly. In these cases the human visitor can perform readings of the plant values needed and record them on paper or in an application on a PC/tablet (any portable computer, including smart phones) for later transcription or downloading. However, this methodology can be error prone, which may be very costly and dangerous for an industrial operation.

The present invention seeks to address at least the foregoing issues, for example, by blending automation and radio technology with on-site visits in an economically advantaged, augmented way, as discussed in connection with figures below.

Figure 2:
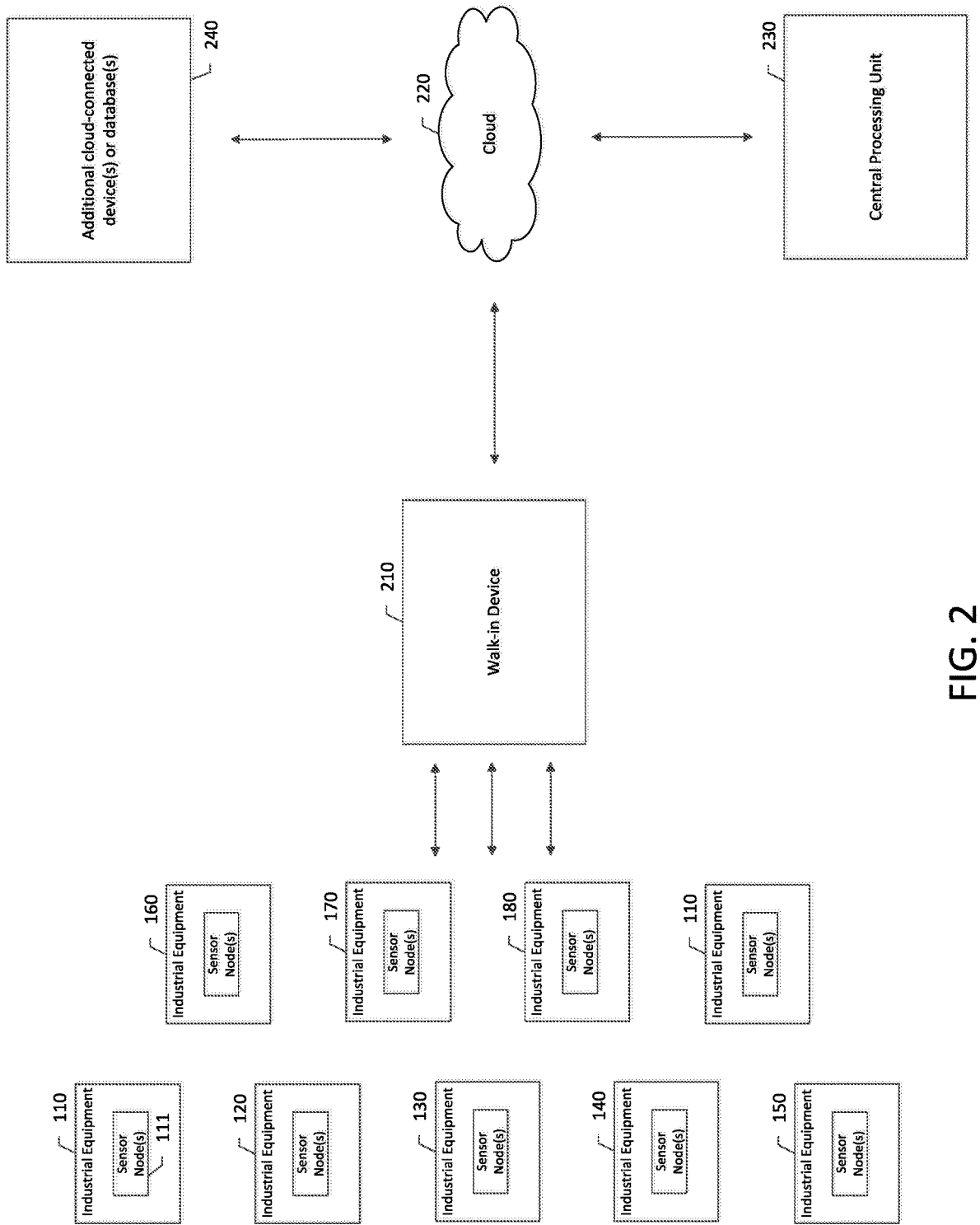
FIG. 2 shows another example industrial system in accordance with embodiments of the disclosure.

Referring now to FIG. 2, in which like elements in FIG. 1 are shown having like reference designations, a system in accordance with embodiments of this disclosure includes a so-called "walk-in device" 210. The walk-in device 210, which may include a processor and a memory device with computer instructions stored thereon, for example, as discussed further below in connection with FIG. 7, may be communicatively coupled to the industrial equipment 110, 120, 130, 140, 150, 160, 170, 180, 190 for collecting data from industrial equipment 110, 120, 130, 140, 150, 160, 170, 180, 190 and performing one or more other actions (e.g., maintenance, as will be discussed further below).

Figure 3:
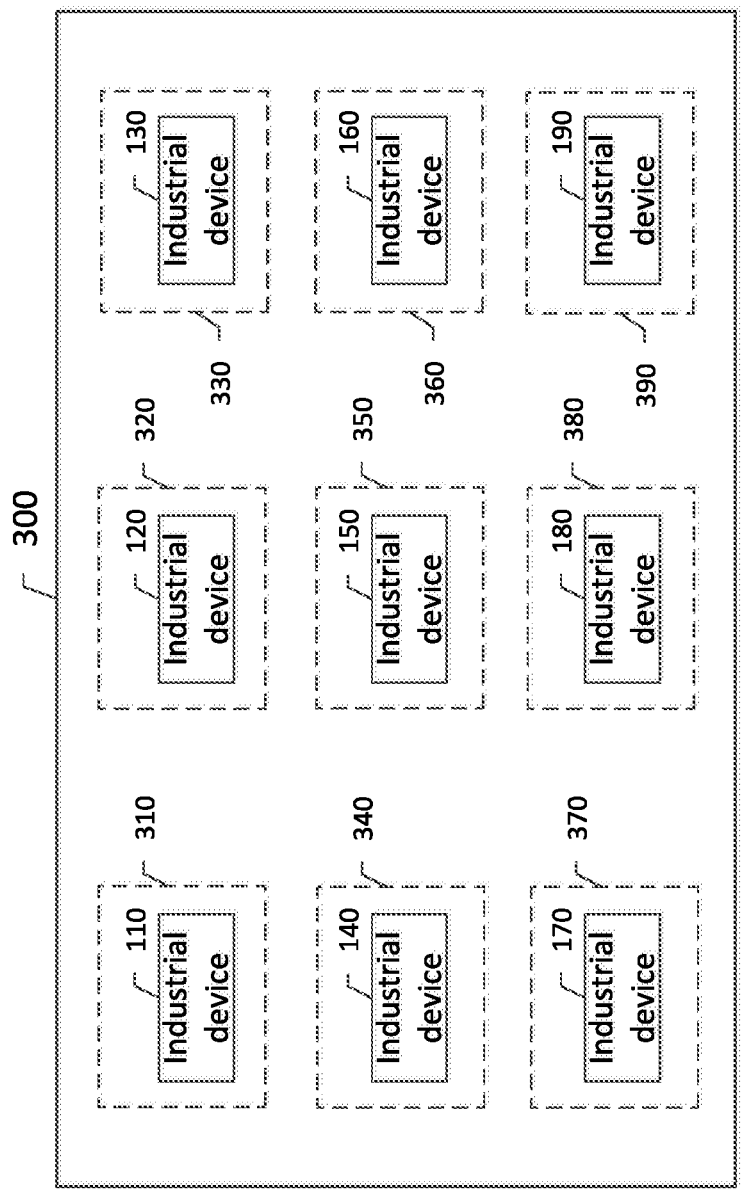
FIG. 3 shows a further example industrial system in accordance with embodiments of the disclosure.
Figure 3A:
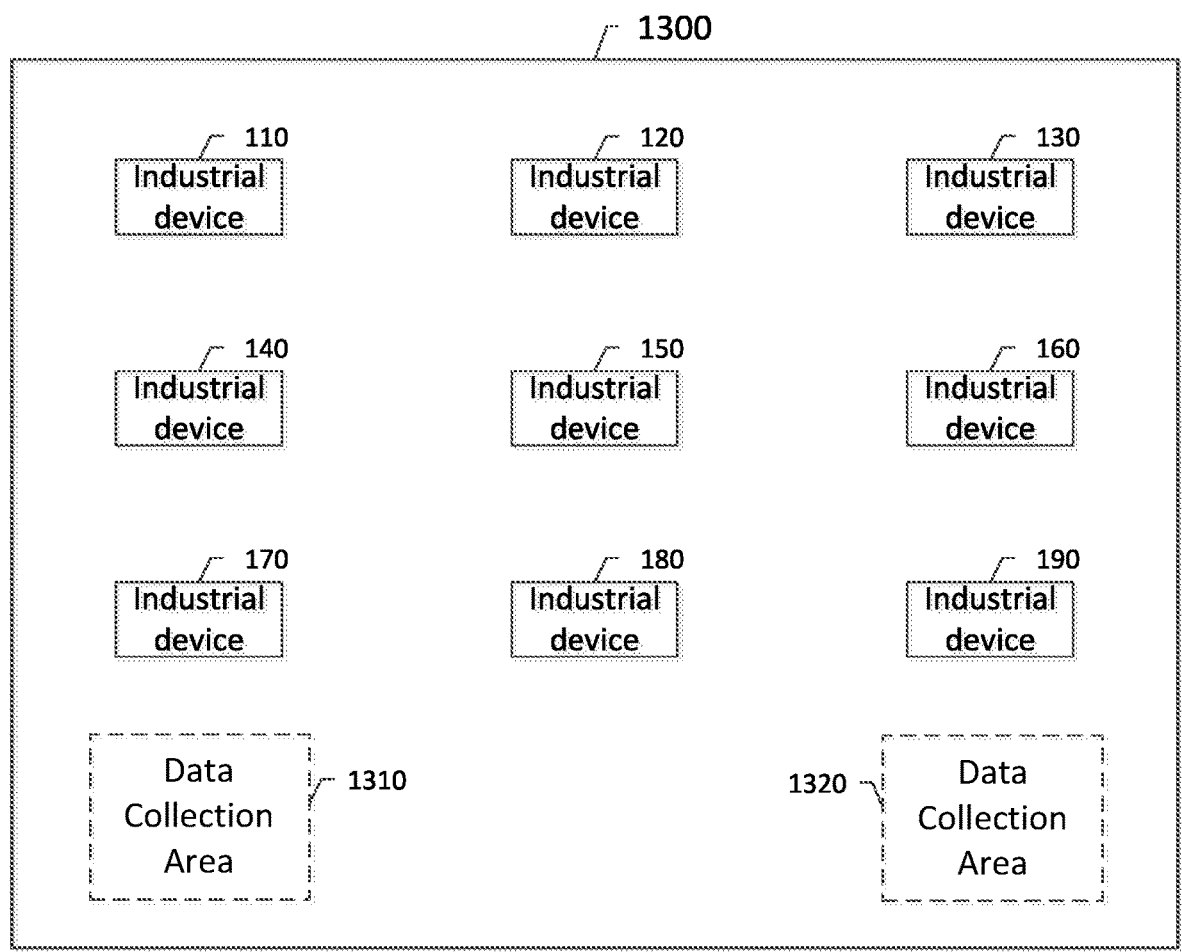
FIG. 3A shows another example industrial system in accordance with embodiments of the disclosure.
Figure 3B:
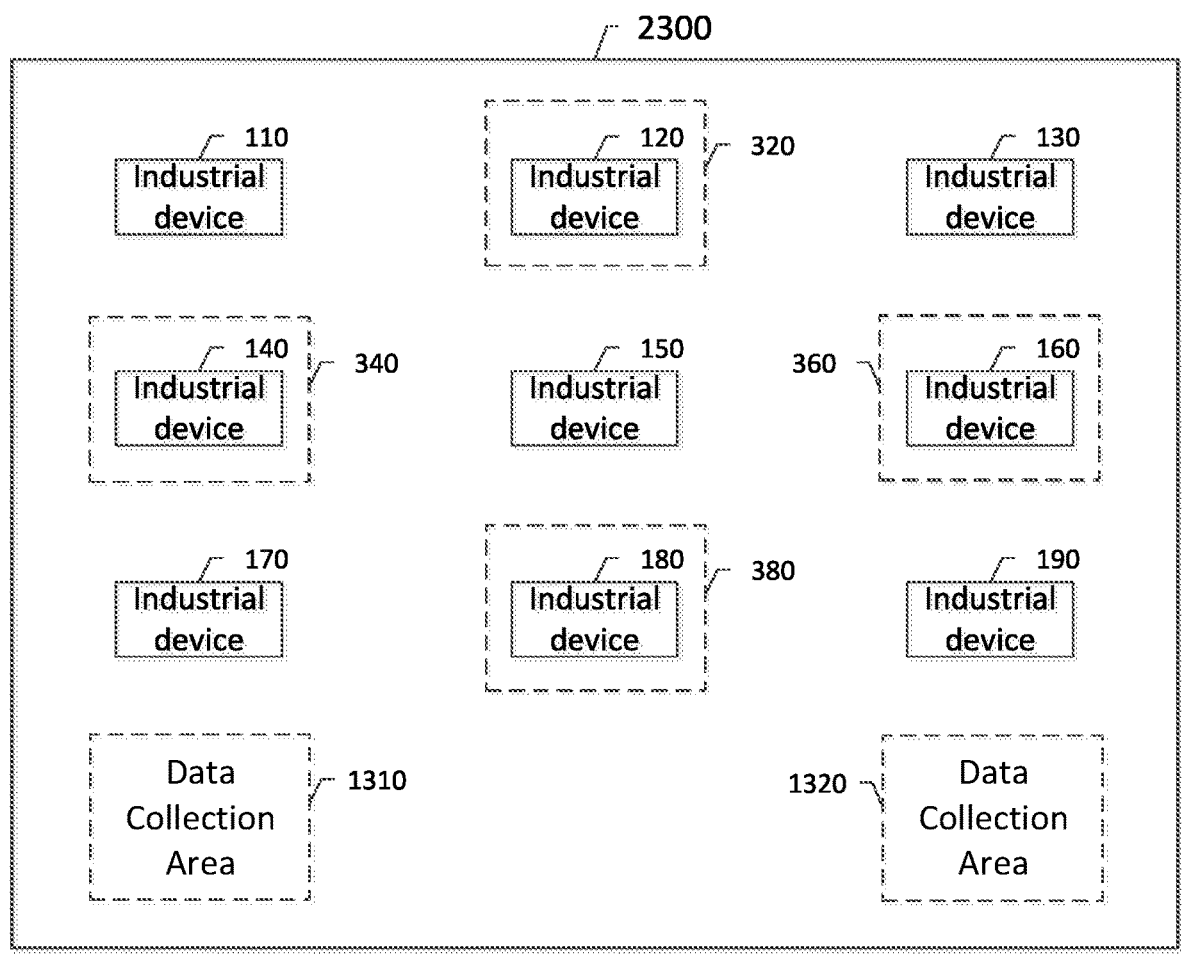
FIG. 3B shows a further example industrial system in accordance with embodiments of the disclosure.

Referring also to FIGS. 3-3B, in accordance with embodiments of this disclosure, the walk-in device 210 may be automatically communicatively coupled to the industrial equipment 110, 120, 130, 140, 150, 160, 170, 180, 190, for example, in response to the walk-in device 210 entering a data collection area (or areas) in a facility, facilities or sites in which the industrial equipment 110, 120, 130, 140, 150, 160, 170, 180, 190 are located. In some embodiments, the data collection area (or areas) include or correspond to an area (or areas) proximate to the industrial equipment 110, 120, 130, 140, 150, 160, 170, 180, 190, for example, as indicated by reference designators 310, 320, 330, 340, 350, 360, 370, 380, 390 in FIG. 3. Additionally, in some embodiments, the data collection area (or areas) include or correspond to a designated area (or areas) in the facility, facilities or site(s) in which the industrial equipment 110, 120, 130, 140, 150, 160, 170, 180, 190 are located, for example, as indicated by reference designators 1310, 1320 in FIG. 3A. Further, referring to FIG. 3B, in some embodiments the data collection area (or areas) include or correspond to an area (or areas) proximate to select ones of the industrial equipment 120, 140, 160, 180 (as indicated by reference designators 320, 340, 360, 380), and also include or correspond to a designated area (or areas) in the facility, facilities or site(s) in which the industrial equipment 110, 120, 130, 140, 150, 160, 170, 180, 190 are located (as indicated by reference designators 1310, 1320).

Returning now to FIG. 2, in one embodiment the industrial equipment 110, 120, 130, 140, 150, 160, 170, 180, 190 are communicatively coupled to the walk-in device 210 using WiFi, Bluetooth, Zigbee and/or another suitable wireless technology in response to the walk-in device 210 entering the data collection area(s). As noted in the Summary Section of this disclosure, the walk-in device 210 may take the form of a mobile device, for example, a device that may be carried by a system user, operator or maintenance personnel (e.g., into the collection area(s)). Additionally, the walk-in device 210 may take the form of, or be integrated with, a robot, an unmanned aerial vehicle (such as a drone) or similar device capable of navigating an industrial facility or operation (e.g., into the collection area(s)). The walk-in device 210 may include suitable wireless technologies to enable communicatively coupling with the industrial equipment 110, 120, 130, 140, 150, 160, 170, 180, 190. It is understood that one or more of the industrial equipment 110, 120, 130, 140, 150, 160, 170, 180, 190 may additionally or alternatively be communicatively coupled to the walk-in device 210 using one or more wired technologies (e.g., Ethernet) in some embodiments, for example, in embodiments in which the one or more industrial equipment 110, 120, 130, 140, 150, 160, 170, 180, 190 do not have a suitable connections or capabilities.

In accordance with some embodiments of this disclosure, the walk-in device 210 may be communicatively coupled to a central processing unit 230 via the "cloud" 220, for example, for sharing data collected by the industrial equipment 110, 120, 130, 140, 150, 160, 170, 180, 190. In some embodiments, the walk-in device 210 may be directly communicatively coupled to the cloud 220, as walk-in device 210 is in the illustrated embodiment. In other embodiments, the walk-in device 210 may be indirectly communicatively coupled to the cloud 220, for example, through an intermediate device, such as a cloud-connected hub (or a gateway). The cloud-connected hub (or the gateway) may, for example, provide the walk-in device 210 with access to the cloud 220 and the central processing unit 230.

As used herein, the terms "cloud" and "cloud computing" are intended to refer to computing resources connected to the Internet or otherwise accessible to the walk-in device 210 via a communication network, which may be a wired or wireless network, or a combination of both. The computing resources comprising the cloud 220 may be centralized in a single location, distributed throughout multiple locations, or a combination of both. A cloud computing system may divide computing tasks amongst multiple racks, blades, processors, cores, controllers, nodes or other computational units in accordance with a particular cloud system architecture or programming. Similarly, a cloud computing system may store instructions and computational information in a centralized memory or storage, or may distribute such information amongst multiple storage or memory components. The cloud system may store multiple copies of instructions and computational information in redundant storage units, such as a RAID array.

The central processing unit 230 may be an example of a cloud computing system, or cloud-connected computing system. In embodiments, the central processing unit 230 may be a server located within buildings in which the industrial equipment are provided, or may be remotely-located cloud-based service. The central processing unit 230 may include computing functional components similar to those of the walk-in device 210 some embodiments, but may generally possess greater numbers and/or more powerful versions of components involved in data processing, such as processors, memory, storage, interconnection mechanisms, etc. The central processing unit 230 can be configured to implement a variety of analysis techniques to identify patterns in received data from the walk-in device 210, as discussed further below. The various analysis techniques discussed herein further involve the execution of one or more software functions, algorithms, instructions, applications, and parameters, which are stored on one or more sources of memory communicatively coupled to the central processing unit 230. In certain embodiments, the terms "function", "algorithm", "instruction", "application", or "parameter" may also refer to a hierarchy of functions, algorithms, instructions, applications, or parameters, respectively, operating in parallel and/or tandem. A hierarchy may comprise a tree-based hierarchy, such a binary tree, a tree having one or more child nodes descending from each parent node, or combinations thereof, wherein each node represents a specific function, algorithm, instruction, application, or parameter.

In embodiments, since the central processing unit 230 is connected to the cloud 220, it may access additional cloud-connected devices or databases 240 via the cloud 220. For example, the central processing unit 230 may access the Internet and receive information such as weather data, utility pricing data, or other data that may be useful in analyzing the data received from the walk-in device 210. In embodiments, the cloud-connected devices or databases 160 may correspond to a device or database associated with one or more external data sources. Additionally, in embodiments, the cloud-connected devices or databases 160 may correspond to a user device from which a user may provide user input data. A user may view information about the walk-in device 210 and/or the industrial equipment (e.g., device make, model, type, etc.) and data collected by the walk-in device 210 and/or the industrial equipment using the user device. Additionally, in embodiments the user may configure the walk-in device 210 and/or the industrial equipment using the user device.

In embodiments, by leveraging the cloud-connectivity and enhanced computing resources of the central processing unit 230 relative to the walk-in device 210, sophisticated analysis can be performed on data retrieved from the walk-in device 210, as well as on the additional sources of data discussed above, when appropriate. This analysis can be used to dynamically control one or more parameters, processes, conditions or equipment (e.g., loads) associated with the industrial system.

In embodiments, the parameters, processes, conditions or equipment are dynamically controlled by a control system associated with the industrial system. In embodiments, the control system may correspond to or include one or more of the industrial equipment, central processing unit 230 and/or other devices within or external to the industrial system.

Figure 4:
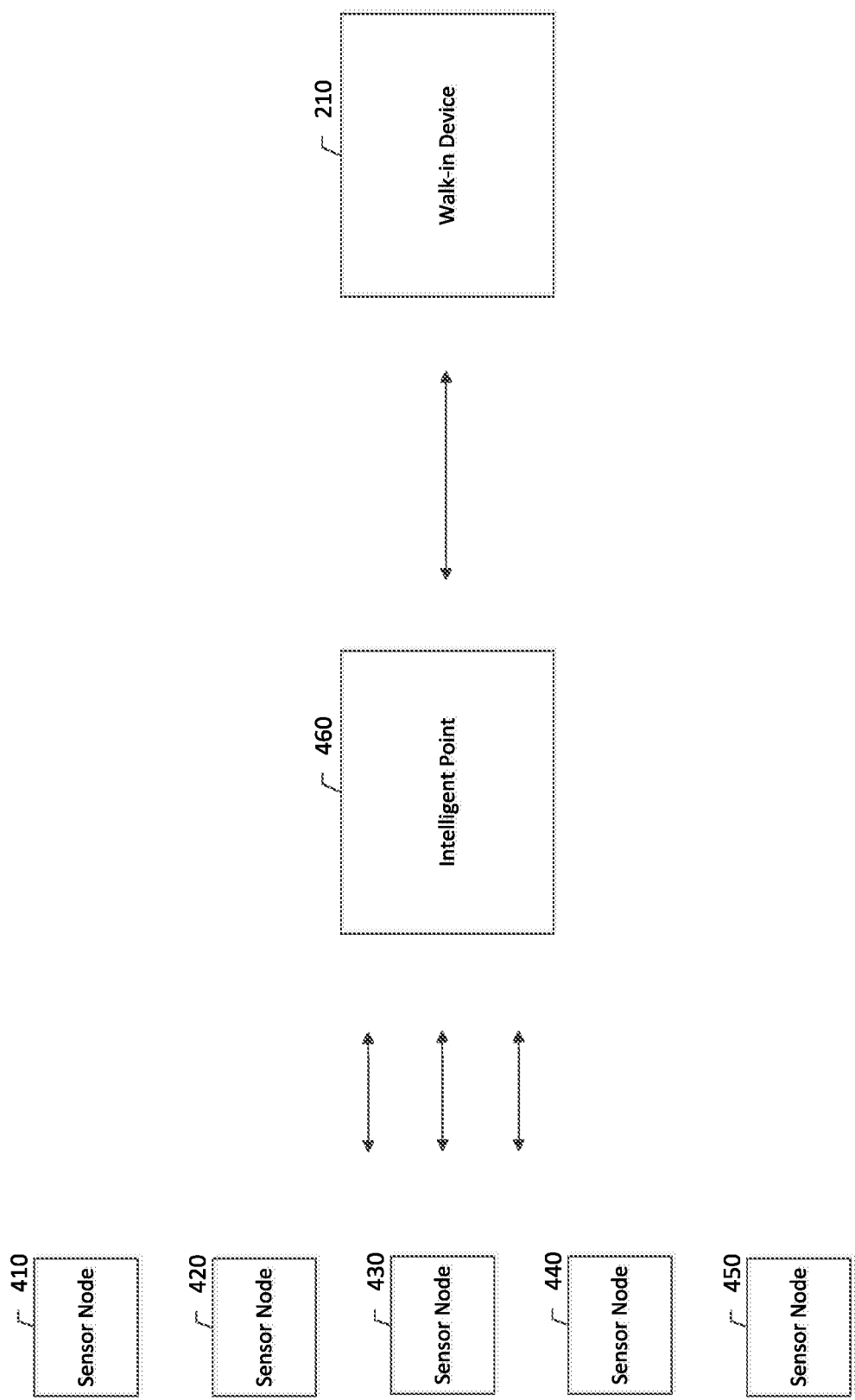
FIG. 4 shows various aspects of an example implementation of an industrial system in accordance with embodiments of the disclosure.

It is understood that the system shown in FIG. 2 is but one or many potential configurations of systems in accordance with embodiments of this disclosure. For example, in some embodiments the system may include one or more intelligent points (e.g., computing devices with one or more processors and memory devices) for pre-processing of data collected by industrial equipment 110, 120, 130, 140, 150, 160, 170, 180, 190 before the data is received by the walk-in device 210. For example, referring briefly to FIG. 4, in some embodiments industrial equipment may include one or more sensor nodes (here, sensor nodes 410, 420, 430, 440, 450), with each of the sensor nodes configured to monitor or measure one or more parameters. For example, sensor node 410 may be configured to measure pressure, sensor node 420 may be configured to measure temperature, sensor node 430 may be configured to measure flow, sensor node 440 may be configured to measure vibration, and sensor node 440 may be configured to measure one or more other parameters. Data collected by each of the sensor nodes 410, 420, 430, 440, 450 (i.e., a cluster of sensor nodes) may be provided to an intelligent point 460, for example, for pre-processing the collected data. For example, the intelligent point 460 may pre-process the collected data to determine one or more computed values, such as number of events occurring in the industrial system, duration(s), average value(s), maximum value(s), minimum value(s), waveforms, etc. In accordance with embodiments of this disclosure, the computed data (and any other pre-processed data) may be provided to the walk-in device 210 for further processing, for example, to determine if maintenance (e.g., software updates, calibration) needs to be, or is recommended to be, performed on the industrial equipment, and/or to identify issues with one or more of the industrial equipment.

In accordance with some embodiments of this disclosure, the configuration discussed above allows for the sensor nodes 410, 420, 430, 440, 450 to be provided as "lower" end devices with limited capabilities (saving costs for customers). More particularly, by providing an intelligent point 460 with processing (or pre-processing) capabilities, the sensor nodes 410, 420, 430, 440, 450 do not need to perform any (or may only perform limited) processing. In this regard, the sensor nodes 410, 420, 430, 440, 450 can focus on monitoring or measuring respective parameters, leaving the processing (e.g., potentially resource intensive processing) to the intelligent point 460 (and the walk-in device 210).

The above-discussed configuration may also allow for the sensor nodes 410, 420, 430, 440, 450 to be provided as limited range devices, with the ability to transmit data over shorter distances than is typically required of sensor devices in an industrial operation (saving costs for customers). For example, the sensor nodes 410, 420, 430, 440, 450 may transmit data collected by the sensor nodes 410, 420, 430, 440, 450 to the intelligent point 460 using low energy Bluetooth, and other relatively short range (and low power) wireless communication technologies. The intelligent point 460 may then transmit data collected from the sensor nodes 410, 420, 430, 440, 450, and pre-processed, to the walk-in device 210 using longer range wireless communication technologies, such as over WiFi and/or cellular networks, if necessary.

In accordance with some embodiments of this disclosure, the sensor nodes 410, 420, 430, 440, 450 may transmit data to the intelligent point 460, and the intelligent point 460 may transmit data to the walk-in device 210, in a number of ways. For example, in some embodiments the sensor nodes 410, 420, 430, 440, 450 may automatically transmit data to the intelligent point 460, and the intelligent point 460 may automatically transmit data to the walk-in device 210 (e.g., in response to the walk-in device 210 being in a data collection area). Additionally, in some embodiments the data transmissions may occur at least in part through a manual process, for example, in response to user input. For example, in some embodiments a user may enable the transfer of data to and/or from the intelligent point 460 through the push of a button on the intelligent point 460, through the push of a button (e.g., a physical or virtual button) on a user device communicatively coupled to the intelligent point 460, and/or through another suitable means depending on the application.

In accordance with some embodiments of this disclosure, the push of a button on the intelligent device 460 may be enabled by a pressing a surface (e.g., a top surface) of a first portion of the intelligent device 460 (e.g., a top piece of the device) towards a surface of a second portion of the intelligence device 460 (e.g., a bottom piece of the device) to initiate (or simulate) a button press. Additionally, in accordance with some embodiments of this disclosure, the data transfer functionality of the intelligent point 460 may be initiated through another means, for example, a configuration in which one or more portions or surfaces of the intelligent point 460 are pushed (or otherwise receive force) by a user to cause elements/components inside the intelligent point 460 to trigger/initiate the data transfer functionality. As one example, the user force may cause a sliding switch in the intelligent point 460 to move left to right, right to left and so forth, and in response thereto the data transfer functionality may be initiated. This configuration may, for example, be particularly suitable in environments in which there is concern about exposure to environmental elements (e.g., liquids entering crevices associated with traditional buttons on surface of devices). It is understood that these are but a few of many potential ways in which data may be transferred, and data transfer functionality may be initiated. It is also understood that the data may be transferred in bulk or in a plurality of segments, for example, depending on the application and device capabilities.

While the illustrated embodiment is shown as including a single intelligent point 460, it is understood that systems in accordance with embodiments of this disclosure may include a plurality of intelligent points in some embodiments. For example, a plurality of intelligent points may be dispersed throughout an industrial operation, for example, in a large building, throughout multiple buildings, and across a site (e.g., a field or fields including agricultural equipment spread throughout, a geographical area including utility equipment, etc.) to provide the benefits discussed above. In one aspect, the plurality of intelligent points may communicate with each other, for example, to share/leverage processing capabilities and extend the range of operation of the system including a plurality of intelligent points. It is understood that other configurations are possible.

Figure 5:
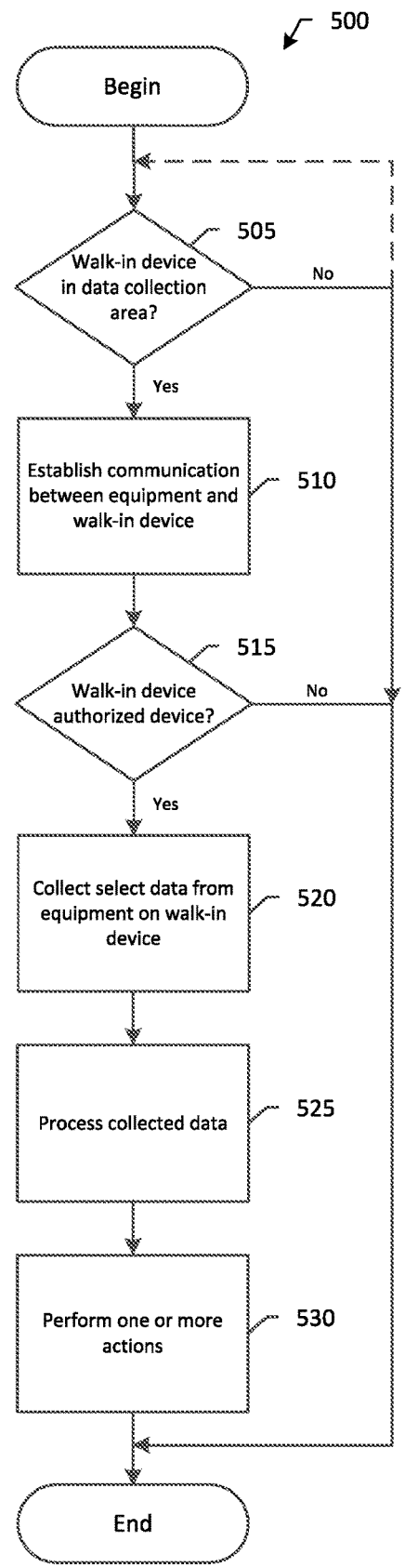
FIG. 5 shows an example method for automatically collecting and analyzing data from industrial equipment in accordance with embodiments of this disclosure.
Figure 5A:
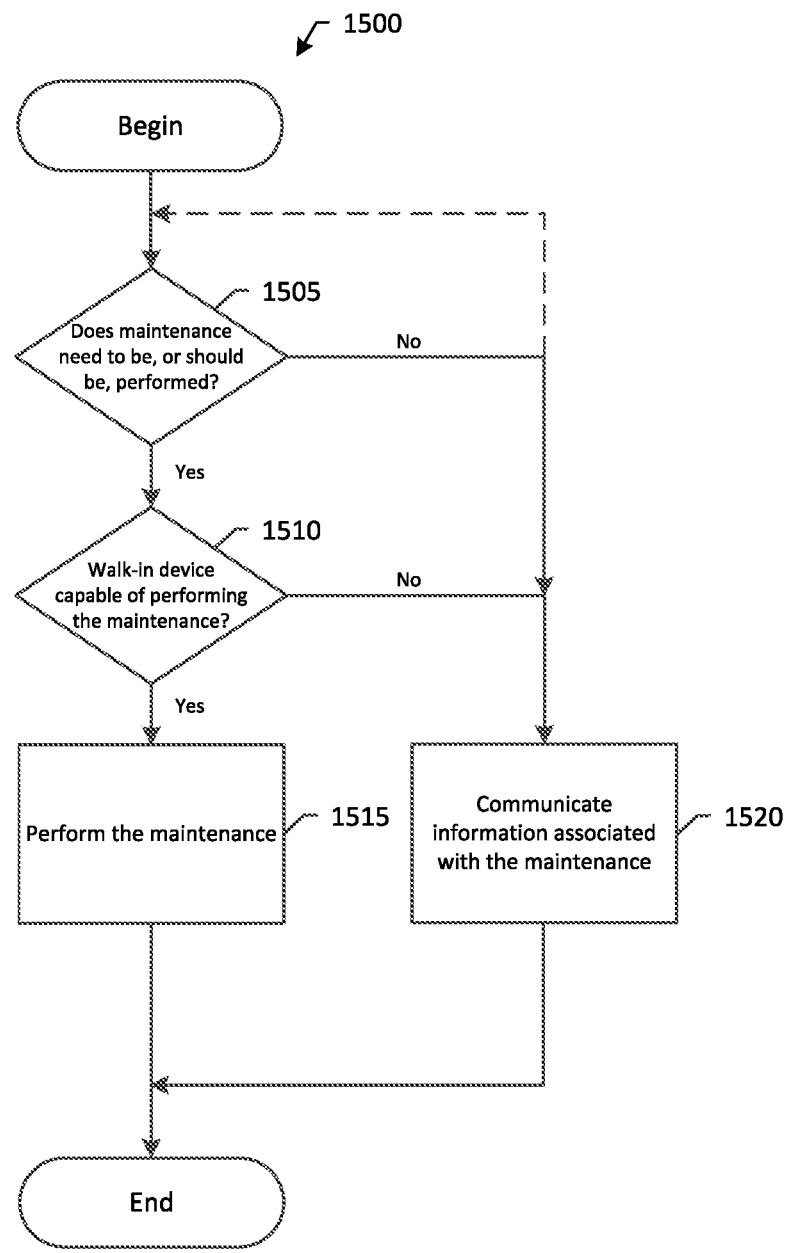
FIG. 5A shows an example method for processing and taking actions in response to collected data, for example, data collected using the method shown in FIG. 5.
Figure 5B:
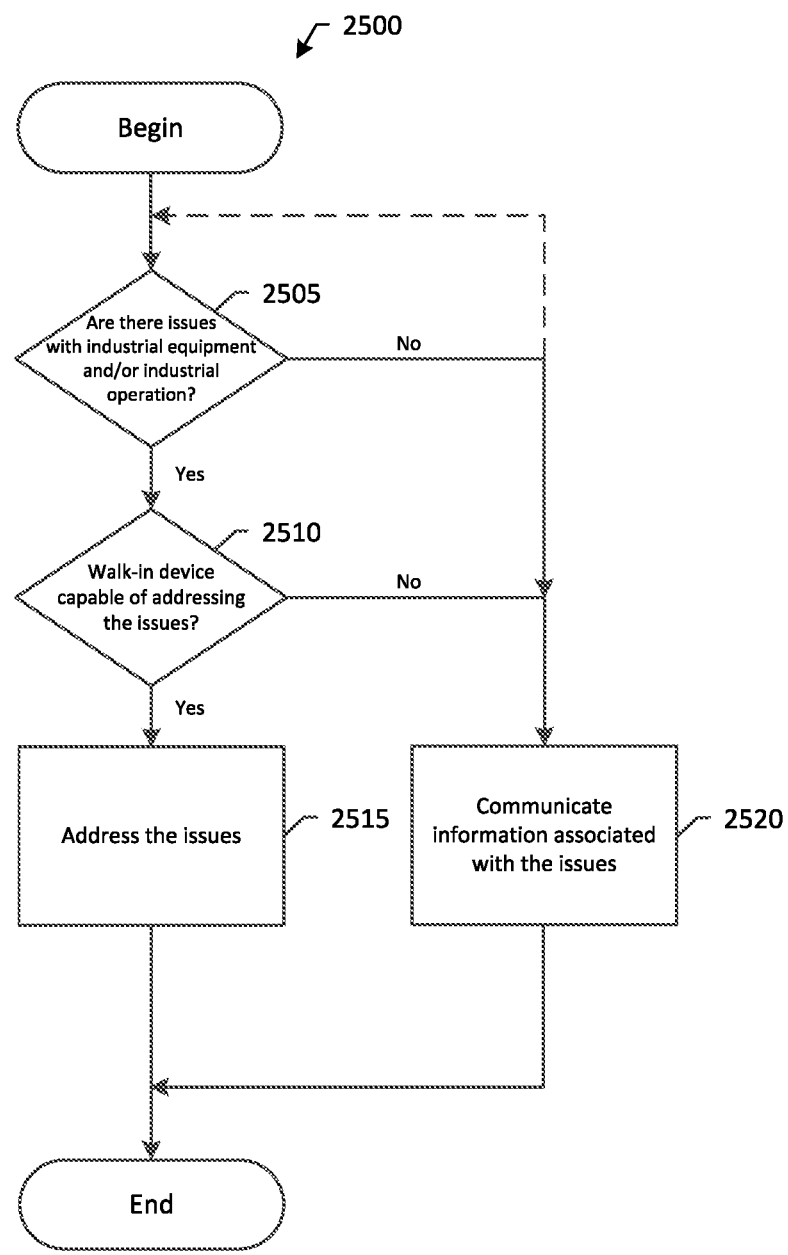
FIG. 5B shows another example method for processing and taking actions in response to collected data, for example, data collected using the method shown in FIG. 5.
Figure 5C:
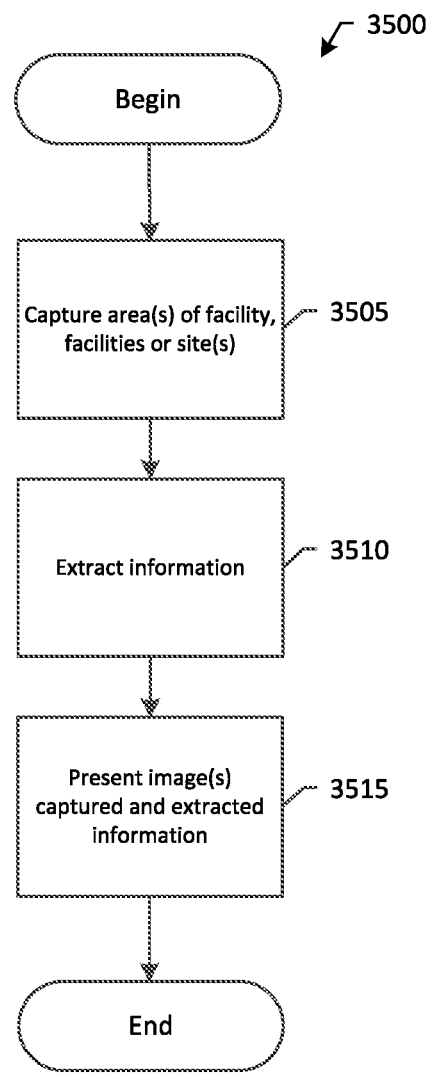
FIG. 5C shows another example method for automatically collecting and analyzing data from industrial equipment in accordance with embodiments of this disclosure.

Referring to FIGS. 5-5C, flowcharts (or flow diagrams) are shown to illustrate example methods in accordance with embodiments of this disclosure, for example, for automatically collecting and analyzing data from industrial equipment. Rectangular elements (typified by element 510 in FIG. 5), as may be referred to herein as "processing blocks," may represent computer software and/or algorithm instructions or groups of instructions. Diamond shaped elements (typified by element 505 in FIG. 5), as may be referred to herein as "decision blocks," represent computer software and/or algorithm instructions, or groups of instructions, which affect the execution of the computer software and/or algorithm instructions represented by the processing blocks. The processing blocks and decision blocks (and other blocks shown) can represent steps performed by functionally equivalent circuits such as a digital signal processor circuit or an application specific integrated circuit (ASIC).

The flowcharts do not depict the syntax of any particular programming language. Rather, the flowcharts illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied. Thus, unless otherwise stated, the blocks described below are unordered; meaning that, when possible, the blocks can be performed in any convenient or desirable order including that sequential blocks can be performed simultaneously and vice versa. It will also be understood that various features from the flowcharts described below may be combined in some embodiments. Thus, unless otherwise stated, some features from the flowcharts described below may be combined with other features of the flowchart described below, for example, to capture the various advantages and aspects of systems and methods associated with automatically collecting and analyzing data from industrial equipment sought to be protected by this disclosure. It is also understood that various features from the flowcharts described below may be separated in some embodiments. For example, while the flowcharts are shown having many blocks, in some embodiments the illustrated methods shown by the flowcharts may include fewer blocks or steps.

Referring to FIG. 5, a flowchart illustrates an example method 500 for automatically collecting and analyzing data from industrial equipment, for example, a plurality of industrial equipment. The plurality of industrial equipment may be provided in a facility, or be distributed over multiple facilities or sites associated with an industrial operation, as a few examples. Method 500 may be implemented, for example, on a processor associated with the industrial operation, for example, on a processor of a walk-in device (e.g., 210, shown in FIG. 2) or on a processor of another computing device associated with the industrial operation.

As illustrated in FIG. 5, the method 500 begins at block 505, where it is determined if the walk-in device is in a data collection area (or areas) of a facility, facilities or site(s) in which the plurality of industrial equipment is provided. As discussed above, the data collection area(s) may correspond to a designated area (or areas) in a facility or geographic area for collecting data from one or more of the plurality of equipment. As also discussed above, each piece of equipment may have its own respective data collection area (or areas) in some embodiments, or may share its data collection area(s) with other devices in other embodiments. In embodiments, the walk-in device may enter the data collection area(s) autonomously, semi-autonomously, or manually (e.g., when the walk-in device is carried by a system operator).

In accordance with embodiments of the disclosure, the determination of whether the walk-in device is in a data collection area (or areas) may occur in a number of different ways. For example, in some embodiments the walk-in device may ping a base station (or stations) in the data collection area(s) to indicate its presence in the data collection area(s), and from this it may be determined that the walk-in device is in the data collection area(s). Additionally, in some embodiments the walk-in device may temporarily couple to the base station(s) in the data collection area(s) upon entering the data collection area(s), and this act may indicate that the walk-in device is in the data collection area(s). The walk-in device can also scan for broadcast messages, for example, from industrial equipment (and their sensor node(s)) in, near, or associated with the data collection area(s), and/or from an intelligent point (such as intelligent point 460, shown in FIG. 4). Detection of the broadcast messages can, for example, be indicative of the walk-in device being in (or, in some instances near) the data collection area(s).

If it is determined that the walk-in device is a data collection area (or areas), the method may proceed to block 510. Alternatively, if it is determined that the walk-in device is not in a data collection area (or areas), the method may return to block 505 or end in some embodiments.

At block 510, communication is automatically established between sensors (or sensor nodes) of the plurality of equipment associated with the data collection area(s) in which the walk-in device's presence is detected, and the walk-in device. In accordance with embodiments of this disclosure, the communication may be automatically established using Bluetooth (such as low energy Bluetooth), WiFi, Zigbee and/or other wireless technologies. Establishing of communication using wireless technologies is well known in the art, and thus is not described in detail herein.

At block 515, it is determined if the walk-in device is an authorized device for accessing data from the industrial equipment associated with the data collection area(s). In accordance with embodiments of the disclosure, the determination is made using one or more authentication mechanisms. The authenticated mechanism may include, for example, Bluetooth pairing, Extensible Authentication Protocol (EAP), and other authentication mechanisms well known in the art. If it is determined that the walk-in device is an authorized device, the method may proceed to block 520. Alternatively, if it is determined that the walk-in device is not an authorized device, the method may return to block 505 or end in some embodiments.

At block 520, the walk-in device automatically collects select data from the industrial equipment for which the walk-in device is authorized to collect data, as determined at block 515. The select data may correspond, for example, to data needed for diagnosing issues with the industrial equipment and/or for determining maintenance (e.g., software updates, calibration) required or recommended for the industrial equipment.

At block 525, the collected data is processed. In accordance with some embodiments of this disclosure, the collected data is processed on the walk-in device. Additionally, in accordance with some embodiments of this disclosure, the collected data may be processed on another computing device (e.g., Edge gateway or other cloud computing device), for example, in response to the walk-in device transmitting the collected data (or data indicative of the collected data) to the other computer device.

In some embodiments, the collected data may be uploaded from the walk-in device to the other computing device automatically in the data collection area(s), or in response to the walk-in device entering a designated data upload area (or areas). As discussed above, the data collection area(s) and the data upload area(s) may be one in the same in some embodiments, and/or overlap in some embodiments.

In other embodiments, the collected data may be uploaded in response to a button push or other interaction or gesture by a system operator, for example, in the data collection area(s), data upload area(s) or another area.

More details related to example ways in which the collected data may be processed (i.e., analyzed) on the walk-in device and/or the other computing device are discussed in connection with FIGS. 5A and 5B, for example.

At block 530, one or more actions are taken or performed based on the processing (i.e., analysis) occurring at block 525. For example, as discussed further below in connection with FIG. 5A, maintenance may be performed on one or more of the industrial equipment in some embodiments. As another example, issues with the industrial equipment and/or the industrial operation associated with the industrial operation may be corrected and/or reported, as discussed further below in connection with FIG. 5B.

Subsequent to block 530, the method 500 may end in some embodiments. In other embodiments, the method 500 may return to block 505 and repeat again. In some embodiments in which the method ends after block 530, the method may be initiated again, for example, in response to the walk-in device re-entering the data collection area(s) for which data was previously collected, and/or in response to the walk-in device entering other data collection area(s).

It is understood that method 530 may include one or more additional blocks in some embodiments.

Referring now to FIG. 5A, another example method in accordance with embodiments of this disclosure is shown. The method 1500 may, for example, correspond to example steps performed at blocks 525 and 530 of method 500 discussed above in connection with FIG. 5.

As illustrated in FIG. 5A, the method 1500 begins at block 1505, where collected data (e.g., data collected at block 520 of method 500) is processed to determine if maintenance needs to be, or should be, performed on one or more industrial equipment. As one example, the collected data may be analyzed to determine if software on the industrial equipment is up-to-date. As another example, the collected data may be analyzed to determine if calibration of the industrial equipment is recommended or required. For example, calibration may be recommended after a predetermined time period or usage (e.g., usage hours) of the industrial equipment.

If it is determined that maintenance needs to be, or should be, performed on one or more industrial equipment, the method may proceed to block 1510. Alternatively, if it is determined that maintenance is not required or recommended for the industrial equipment, the method may end or return to block 1505 (e.g., in response to receiving more data).

At block 1510, it is determined if the walk-in device is capable of performing the maintenance. If it is determined that the walk-in device is capable of performing the maintenance, the method may proceed to block 1515. Alternatively, if it is determined that the walk-in device is not capable of performing the maintenance, the method may proceed to block 1520.

At block 1515, the walk-in device takes steps to perform the maintenance. For example, in embodiments in which it is determined that software on the industrial equipment is not up-to-date, the walk-in device may access the latest software and transmit the latest software to the industrial equipment. The latest software may be accessed, for example, from a memory device of the walk-in device and/or one or more external devices. In embodiments in which it is determined that calibration is recommended or required, the walk-in device may step through a calibration process or procedure with the industrial equipment to calibrate the industrial equipment. Similar to the software, the calibration process may be accessed from a memory device of the walk-in device and/or one or more external devices. The steps to perform the maintenance may be occur (and be customized) for each piece of industrial equipment for which maintenance is required or recommended. Additionally, the order in which maintenance is performed on the equipment (e.g., equipment A vs. equipment B) may be based on a number of factors, for example, priority, cost and time to perform the maintenance.

At block 1520, in response to it being determined that the walk-in device is not capable of performing the maintenance, information associated with the maintenance may be communicated. For example, the information may be communicated to an end-user, equipment manufacturer, services team and/or other interested individual or party. The communication may include, for example, at least one of: a report, a text, an email, audibly, and an interface of a screen/display (e.g., a display device of a computing device or system associated with the industrial system). The report, text, etc. may present the severity and priority of the maintenance required or recommended, for example. Additionally, the report, text, etc. may provide information related to costs (e.g., monetary and opportunity costs) associated with the required or recommended maintenance, and/or actionable recommendations for responding to the required or recommended maintenance.

Subsequent to block 1520 (and 1515), the method 1500 may end in some embodiments. In other embodiments, the method 1500 may return to block 1505 and repeat again, for example, in response to more data being collected from the industrial equipment.

Referring now to FIG. 5B, another example method in accordance with embodiments of this disclosure is shown. The method 2500, similar to method 1500, may correspond to example steps performed at blocks 525 and 530 of method 500 discussed above in connection with FIG. 5. In some embodiments the method 2500 may be performed alone or in combination with method 1500 and other methods disclosed herein, for example.

As illustrated in FIG. 5B, the method 2500 begins at block 2505, where collected data (e.g., data collected at block 520 of method 500) is processed to determine if there are any issues with one or more industrial equipment or an industrial operation associated with the industrial equipment. As one example, the collected data may be analyzed to determine if any components in the industrial equipment have failed, or are about to fail (e.g., based on predictive failure analysis). As another example, the collected data may be analyzed to identify patterns in collected data, for example, from two or more of the industrial equipment, to identify issues (or potential issues) with an industrial operation associated with the industrial equipment.

If it is determined that there are issues with the industrial equipment and/or the industrial operation, the method may proceed to block 2510. Alternatively, if it is determined that there are no issues with the industrial equipment and/or the industrial operation, the method may end or return to block 2505 (e.g., in response to receiving more data).

At block 2510, it is determined if the walk-in device is capable of addressing the issues. If it is determined that the walk-in device is capable of addressing the issues, the method may proceed to block 2515. Alternatively, if it is determined that the walk-in device is not capable of addressing the issues, the method may proceed to block 2520.

At block 2515, the walk-in device takes steps to addressing the issues. For example, in embodiments in which it is determined that components in the industrial equipment have failed, or are about to fail, the walk-in device may adjust one or more parameters in the industrial equipment and/or the industrial operation, for example, to extend the life of the components. For example, the walk-in device may activate one or more cooling components (or otherwise adjust temperature) in the industrial operation if it is determined that component failure is due to excess temperatures. Additionally or alternatively, the walk-in device may locate or order replacement components for the industrial equipment. In embodiments in which the walk-in device takes the form a robot, for example, the walk-in device may sometimes be capable of replacing the components in the industrial equipment and/or installing a mitigative device (or devices). It is understood that the above example is but many potential example ways in which the walk-in device may take steps to address the issues. For example, as one further example, a state (e.g., an on/off state) of the industrial equipment may be controlled by the walk-in device in some embodiments.

At block 2520, in response to it being determined that the walk-in device is not capable of addressing the issues, information associated with the issues may be communicated. For example, the information may be communicated to an end-user, equipment manufacturer, services team and/or other interested individual or party. The communication may include, for example, at least one of: a report, a text, an email, audibly, and an interface of a screen/display. The report, text, etc. may present the severity and priority of the issues, for example. Additionally, the report, text, etc. may provide information related to costs (e.g., monetary and opportunity costs) associated with the issues, and/or actionable recommendations for responding to the issues.

Subsequent to block 2520 (and 2515), the method 2500 may end in some embodiments. In other embodiments, the method 2500 may return to block 2505 and repeat again, for example, in response to more data being collected from the industrial equipment.

Referring to FIG. 5C, a flowchart illustrates another example method 3500 for automatically collecting and analyzing data from industrial equipment, for example, a plurality of industrial equipment. In accordance with embodiments of this disclosure, the method 3500 may be implemented alone or in combination with method 500, 1500 and 2500, for example.

As illustrated in FIG. 5C, the method 3500 begins at block 3505, where one or more areas of a facility, facilities, or site(s) are captured, for example, by one or more image capture devices of or associated with a walk-in device in accordance with embodiments of this disclosure. In some embodiments, the areas are automatically captured or are captured in response to user input. In one example implementation, the walk-in device may automatically capture the areas in response to determining or detecting that industrial equipment exists in the areas. For example, the walk-in device may detect the presence of industrial equipment in response to receiving communication broadcasts from the industrial equipment (e.g., in response to the walk-in device entering a data collection area), and/or using one or more object detection techniques. In another example implementation, the walk-in device may capture the areas in response to a user pointing the image capture device(s) of the walk-in device toward the areas, and/or in response to voice commands received from the user (e.g., "capture this area").

Figure 6A:
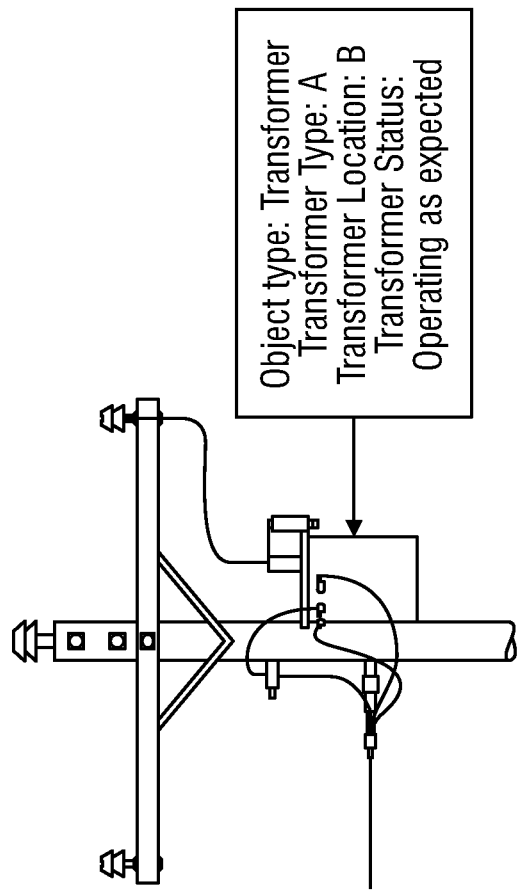
FIGS. 6 and 6A show an example application of the method shown in FIG. 5C, for example.
Figure 6:
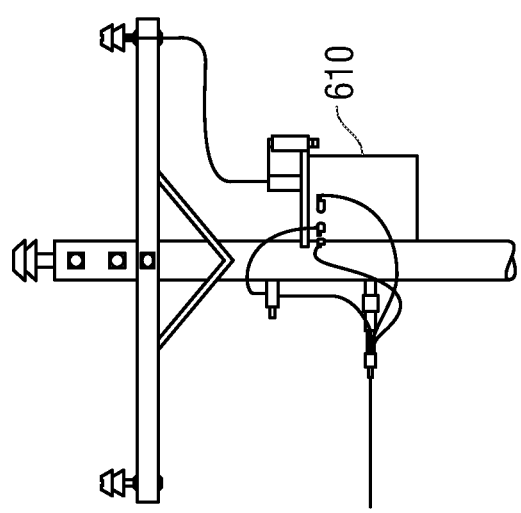

At block 3510, information is extracted from the image(s) captured by the walk-in device. For example, one or more object detection techniques may be used to identify particular industrial equipment in the area(s) associated with the image(s) captured. For example, an object library including characteristics (e.g., dimensions, device type, etc. of various industrial equipment may be accessed and compared with objects in the image(s) to identify the industrial equipment. The characteristics may include, for example, dimensions, color, make, model, etc. of the industrial equipment. Referring briefly to FIG. 6, the object detection techniques and, in some instances, broadcast data, may be used to determine that object 610 is a transformer coupled to a utility pole. Additional characteristics associated with the transformer, such as make, model, and location of the transformer, as well as status information, for example, may further be extracted from the image(s) and/or other forms of data, such as data collected from sensor nodes associated with the transformer. The status information may include alerts and alarms, for example, indicative of object uptime, downtime, component failures, etc.

At block 3515, the image(s) captured and the extracted information are presented on a display device. In accordance with some embodiments of this disclosure, the extracted information is overlayed on the image(s) captured using augmented reality (AR) technology. For example, referring briefly to FIGS. 6 and 6A, information extracted from the image shown in FIG. 6 (and information from other forms of data) may be overlayed on the image to provide the image shown in FIG. 6A. In the illustrated example, the transformer type, location and status information is provided. It is understood that many other types of information (e.g., from the image capture and data obtained by the walk-in device) may be provided. In accordance with some embodiments of this disclosure, the display device on which the image is displayed includes, or corresponds to, a display of the walk-in device. In other embodiments, the display device may correspond to a display of a user device, for example, that is communicatively coupled to the walk-in device. AR technology is well known in the art and, thus is not described in detail herein.

Subsequent to block 3515, the method may end in some embodiments. In other embodiments, the method 3500 may return to block 3505 and repeat again, for example, to identify further industrial equipment.

In some embodiments, the method 3500 may include one or more additional steps. For example, in some embodiments, the method 3500 may include validation of the information extracted and presented. A user may, for example, validate the information through one or more user inputs (e.g., commands) on a user input device. For example, the user may confirm that the type and location of the industrial equipment is correct and, if not, manually provide the correct information. The correct information may then be presented on the display device (e.g., overlayed on the image(s)). It is understood that other additional or alternative steps are of course possible.

Figure 7:
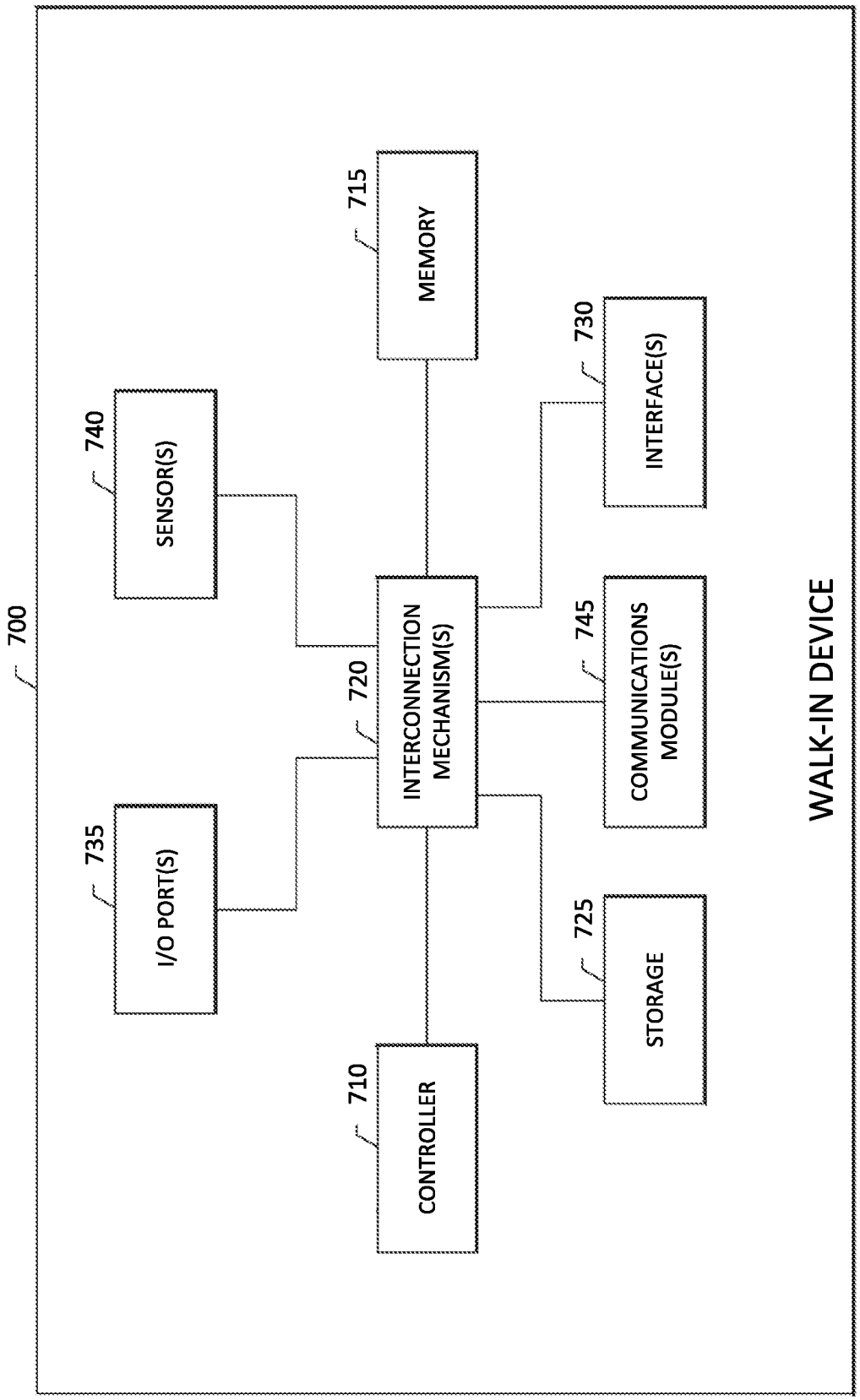
FIG. 7 shows an example configuration of a walk-in device in accordance with embodiments of this disclosure.

Referring to FIG. 7, an example walk-in device 700 that may be suitable for use with the industrial systems shown in FIGS. 1-4, and implementing one or more of the above-discussed methods, for example, includes a controller 710, a memory device 715, storage 725, and an interface 730. The walk-in device 700 also includes an input-output (I/O) port 735, a sensor 740, a communication module 745, and an interconnection mechanism 720 for communicatively coupling two or more walk-in device components 710-745.

The memory device 715 may include volatile memory, such as DRAM or SRAM, for example. The memory device 715 may store programs and data collected during operation of the walk-in device 700. For example, in embodiments in which the walk-in device 700 is configured to monitor and/or collect data from industrial equipment (e.g., 110, shown in FIG. 1), the memory device 715 may store the monitored and/or collected data.

The storage system 725 may include a computer readable and writeable nonvolatile recording medium, such as a disk or flash memory, in which signals are stored that define a program to be executed by the controller 710 or information to be processed by the program. The controller 710 may control transfer of data between the storage system 725 and the memory device 715 in accordance with known computing and data transfer mechanisms. In embodiments, the data monitored and/or collected by the walk-in device 700 may be stored in the storage system 725.

The I/O port 735 can be used to couple external devices, such as sensor devices (e.g., temperature and/or motion sensor devices) and/or user input devices (e.g., local or remote computing devices) (not shown), to the walk-in device 700. The external devices may be local or remote devices, for example, a gateway (or gateways). The I/O port 735 may further be coupled to one or more user input/output mechanisms, such as buttons, displays, acoustic devices, etc., to provide alerts (e.g., to display a visual alert, such as text and/or a steady or flashing light, or to provide an audio alert, such as a beep or prolonged sound) and/or to allow user interaction with the walk-in device 700.

The sensor 740, which may take the form of a camera or other sensor(s) suitable for the application(s) in which the walk-in device 700 is used, may measure or capture information associated with industrial equipment and/or an industrial operation, for example. In embodiments, the information (or select portions of the information) may be communicated using the communication module 745. The communication module 745 may be configured to couple the walk-in device 700 to one or more other devices (e.g., industrial equipment) and external communication networks. These networks may be private networks within a building in which the walk-in device 700 is located, or public networks, such as the Internet. In embodiments, the communication module 745 may also be configured to couple the walk-in device 700 to a cloud-connected hub, or to a cloud-connected central processing unit (e.g., 230, shown in FIG. 2), associated with an industrial system.

The walk-in device controller 710 may include one or more processors that are configured to perform specified function(s) of the walk-in device 700. The processor(s) can be a commercially available processor, such as the well-known Pentium™, Core™, or Atom™ class processors available from the Intel Corporation, or Advanced RISC Machines (ARM) processors by Silicon Labs. Many other processors are available, including programmable logic controllers. The walk-in device controller 710 can execute an operating system to define a computing platform on which application(s) associated with the walk-in device 700 can run.

In embodiments, the data monitored and/or collected by the walk-in device 700 may be received at an input of the controller 710 as walk-in device input data, and the controller 710 may process the monitored and/or collected data to generate walk-in device output data or signals at an output thereof. In embodiments, the walk-in device output data or signals may correspond to an output of the walk-in device 700. The walk-in device output data or signals may be provided at I/O port(s) 735, for example. In embodiments, the walk-in device output data or signals may be received by a cloud-connected central processing unit, for example, for further processing (e.g., to identify maintenance issues or needs of industrial equipment, as briefly discussed above), and/or by equipment to which the walk-in device is coupled (e.g., for controlling one or more parameters associated with the industrial equipment, as will be discussed further below). In one example, the walk-in device 700 may include an interface 730 for displaying visualizations indicative of the walk-in device output data or signals. The interface 730 may correspond to a graphical user interface (GUI) in embodiments.

Components of the walk-in device 700 may be coupled together by the interconnection mechanism 720, which may include one or more busses, wiring, or other electrical connection apparatus. The interconnection mechanism 720 may enable communications (e.g., data, instructions, etc.) to be exchanged between system components of the walk-in device 700.

It is understood that walk-in device 700 is but one of many potential configurations of walk-in devices in accordance with various aspects of the disclosure. For example, walk-in devices in accordance with embodiments of the disclosure may include more (or fewer) components than walk-in device 700. Additionally, in embodiments one or more components of walk-in device 700 may be combined. For example, in embodiments memory 715 and storage 725 may be combined.

It is also understood that the systems and methods disclosed herein have many advantages and aspects. For example, as discussed above in connection with FIG. 5C, it is contemplated that the camera (i.e., image capture device) of a walk-in device (tablet, etc.) may be used, for example, to "scan" an industrial facility or site before leaving. Such a scan can be video-recorded easily. But, more importantly, such a scan can have alerts and alarms overlaid on the image for humans to see trouble spots—literally labelled over the video image in front of their eyes.

This video augmentation approach can add valuable and easy-to-use new data forms and new highly informative representations of that data. For instance a sensor could arrange for its value (say when in alarm) to paint a message in red (and green when not) over the area it is sampling when such an area comes into view from the tablet camera on the tablet screen. This is known as "augmented reality"—where the readings are preferably portrayed over the actual image of the real instrument in the location as viewed live through the camera and screen combination of the tablet (et al.). The sensors need only know their own location and report that to the tablet, which we have already allowed for in the design of our sensors. The tablet knows its own location, and from commonly deployed internal sensors all the angles of presentation of the camera (e.g. the compass heading, tilt, etc.). From these basic data the tablet or PC constructs the Virtual Reality image of that scene's actual image, say a well head or other process, with the relevant data overlaid on the same screen, as if "floating" over the relevant device or point.

It is also contemplated that Inventory management can be done using the systems and methods disclosed herein. For example, sensors reporting in are implicitly telling the walk-in device (e.g., operator's tablet) that they are alive, well, and operating, and also that the process-point which they are monitoring is at a certain status (so much fluid remains in a tank for instance).

In addition the information is physically secure as it never leaves the immediate vicinity unless within the secure tablet/PC (Bluetooth or Wi-Fi power is low so range is low)—the data can be operationally or even cryptographically secured. "Operationally secure" means that even the operator walking in, might not be allowed to read the results (avoids collusion and fraud for instance).

The health of the sensors themselves can be reported to the operator and using a tally of expected reports. Any that do not occur can be flagged such that the operator can investigate and possibly take corrective action in the same visit—avoiding returns and extra expense.

In summary, in one aspect the human operator may be as before with all the flexibility and adaptability that represents—but now their time looking into items better covered by automation is saved and well spent, in addition mistakes and omissions are avoided, alarms are automatic, data transfer is complete and secure and costs are very low. Such human operator staff can visit more sites in the same time as they did before when using purely manual visits. Augmentation of the human reporting visit retains the best of both worlds—the flexible fully human visit, and the infallible but expensive fully detailed automatic setup.

As illustrated throughout this disclosure, the present invention may blend automation and radio technology with on-site visits in an economically advantaged, augmented way. In one example implementation, this is done by having radio-connected sensors at the site—but does not require any backhaul of them. Instead their controlling base radio senses the arrival or appearance of a human operator/visitor (or his/her equipment) to the site and reports in to his/her personally carried-in equipment automatically. The sensors or base radios preferably store data for whatever durations are necessary until this visit occurs. That is they preferably retain and secure data until a verified PC/tablet is on site that is authorized to collect the data, and they preferably verify it has been correctly relayed before erasing any data.

Further it becomes possible that when a human operator does visit the site, application data preferably can be sent to his/her PC/tablet (or walk-in device) even without their involvement. This has many advantages. For example, maintenance staff no longer need worry about forgetting to read a value (regardless of distractions, weather or accessibility), because the sensor/base radio automatically discovers when there's a visit and downloads its own history into the human's PC/tablet without action on the part of the visiting member of staff—and also it can verify this is acceptable before releasing the storage of that record. Transfer is a transacted process—avoiding accidental loss of data.

It is understood that a human can easily read the values they know about—but what if new gear was installed (potentially by a third party) and the human operator has simply not been informed yet? Under the approaches disclosed herein, the augmented read from those new sensors may be automatically added to the others and they all log themselves as "new" into the tablet/PC (or walk-in device), with their relevant data sent additionally and automatically.

Another example advantage is the disclosed augmented approach avoids errors in the readings—no mistakes of misreading gauges, etc. The sensors read values without errors and report without making transcription mistakes as human staff are wont to do. A further example advantage is costs are extremely low and there are no added ongoing costs (no opex). The visiting operator can be informed by such a system (e.g., walk-in device) of needed maintenance or emergency repairs as soon as they arrive and are detected as present on site. In addition, the cost of the visit is further lowered as the time spent on site is itself lowered and mistakes avoided (no need for follow-up visits on errors).

Another example advantage is the time for the operator to perform the readings on-site is reduced. This approach blends the flexibility and low cost of human visits for these types of installations, with the automation and error-free reporting of full wireless solutions.

In accordance with embodiments of this disclosure, the approach incurs practically no added cost over the regular WSN local collection of data as the discovery and download to the human staff's walk-in device (tablet, etc.) uses the same wireless (potentially) or another low cost separate wireless connection with little or no added hardware devices.

As discussed earlier, in some embodiments, the intelligent point 460 as well as any of the sensor nodes 410, 420, 430, 440, 450 can have a configuration in which the surface of these nodes (or any portion thereof) is pushed or otherwise receives a force provided by a user to cause one or more elements or components inside the nodes to trigger or initiate a data transfer operation or other node operation. In some embodiments, an internal force sensor arrangement is used to detect the user-provided force and initiate a node operation (e.g., wake the node from a sleep state or low power mode to a more power-hungry awake and processing state). Using an internal force sensor can eliminate many of the drawbacks of external buttons and the like on the surface of the node, such as cracks, crevices, and other pass-throughs from the outside of the node housing to the inside of the case.

Pass-throughs allow ingress for dust, liquids, gases, and other unwanted substances into the node and need to be sealed. The sealing mechanisms, however, can become unreliable with age. In the past, designers have gone to great lengths to solve these issues using magnetic arrangements, or with sealed pass-through mechanical arrangements. These solutions have not worked well for a variety of reasons. And for applications that require truly rugged exteriors with thick material walls, solutions requiring magnets and the like work even less well. Despite the less than satisfactory performance of these prior solutions, no solutions currently exist that employ an internal force sensor arrangement as disclosed herein. This void is due in large part to those skilled in the art having a built-in bias, either from training or actual experience, against deploying a force sensor arrangement inside a housing strong enough to withstand industrial environments, such as a housing having a 316L stainless steel base.

Ignoring previous industry biases, embodiments of the network nodes herein leverage the discovery that a metal base, such as a 316L stainless steel base, will flex sufficiently under even tiny loads to be detected when a suitably sensitive deflection detector is used. The discovery showed that even a small amount of deflection in the metal base, often in micro inches, can be detected using currently available microswitches, piezoelectric sensors, and similar force transducers. These deflection detectors/force transducers are well known to those skilled in the art, but have not heretofore been employed inside the housing of an instrument area network node that has a metal base, let alone a 316L stainless steel base, to detect flexing or bending of the base.

Microswitches, like most switches, operate to complete an electrical connection between two conductors. However, unlike conventional switches, the amount of force required to complete the connection in a microswitch is extremely small, usually on the order of a few grams or less. Piezoelectric sensors and similar force transducers also have extremely high sensitivity. Piezoelectric sensors are based on piezoelectric crystals that produce a voltage proportional to the amount of stress/strain on the crystals. The piezoelectric sensors are extremely sensitive to deflection, but the sensor elements themselves exhibit little to no deflection. This rigidity gives piezoelectric sensors ruggedness, a high natural frequency, and good linearity over a wide range of amplitudes.

By providing an internal force sensor that uses microswitches, piezoelectric sensors, and the like, no external buttons or switches are needed on the instrument area network node. A number of advantages may be realized from this arrangement. For example, having no external buttons avoids the need to account for rotational alignment of the node relative to its installation. Normally, with external buttons and a screen, the node would need to be aligned to a user-accessible orientation or direction for use. Once installed, such a node cannot easily be realigned to a different direction. By eliminating the buttons from the node and moving the screen related functions to a separate HMI, embodiments of the present disclosure simplify node installation significantly. Additionally, the internal force sensor embodiments herein preferably have no rotational symmetry, so rotational alignment of the node is also not needed. It is of course possible to have the internal force sensor of the node be responsive to a directional or rotational force within the scope of the disclosed embodiments, depending on the particular application.

Figure 8:
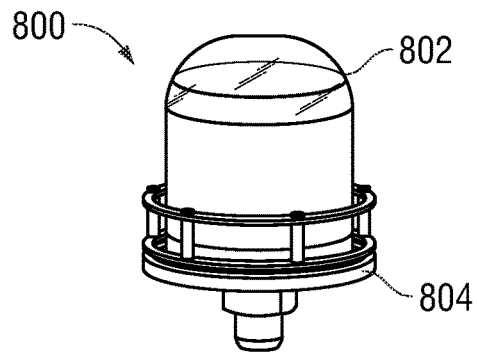
FIG. 8 shows an external view of an exemplary housing for an instrument area network node according to embodiments of the present disclosure.

Referring now to FIG. 8, an exemplary enclosure or housing 800 can be seen for a wireless instrument area network node, such as the intelligent point 460 or any of the sensor nodes 410, 420, 430, 440, 450 discussed herein. Examples of similar wireless instrument area network nodes include any of the ultra-reliable BLE (Bluetooth Low Energy) wireless nodes available from Schneider Electric USA, Inc. of Foxborough, Mass. The particular node shown here is equipped with an internal force sensor according to embodiments of the present disclosure. When thusly equipped, a user simply needs to physically touch (e.g., by hand) or otherwise apply force to the housing 800 to actuate or provide an input to the node. This input may then be used to initiate any number of operations in the node.

In the embodiment of FIG. 8, the housing 800 has two main components, a dome-shaped top portion or cover 802 that is attached to a base plate 804. The dome-shaped cover 802 is preferably made of a glass material while the base plate 804 is preferably made of a stainless steel material, such as 316L stainless steel. Other suitable shapes and materials may of course be used for the cover 802 and the base plate 804 depending on the particular environment where the network node is installed. Preferably there are no pass-throughs or other ingress into the housing 800, such as those that result from having external buttons, LCD or touch screens, and the like on the exterior of the housing 800. The lack of external buttons or screens helps prevent intrusion of liquids, gases, and other unwanted substances into the interior of the housing 800, which can compromise electronics and other components therein over time.

Figure 9:
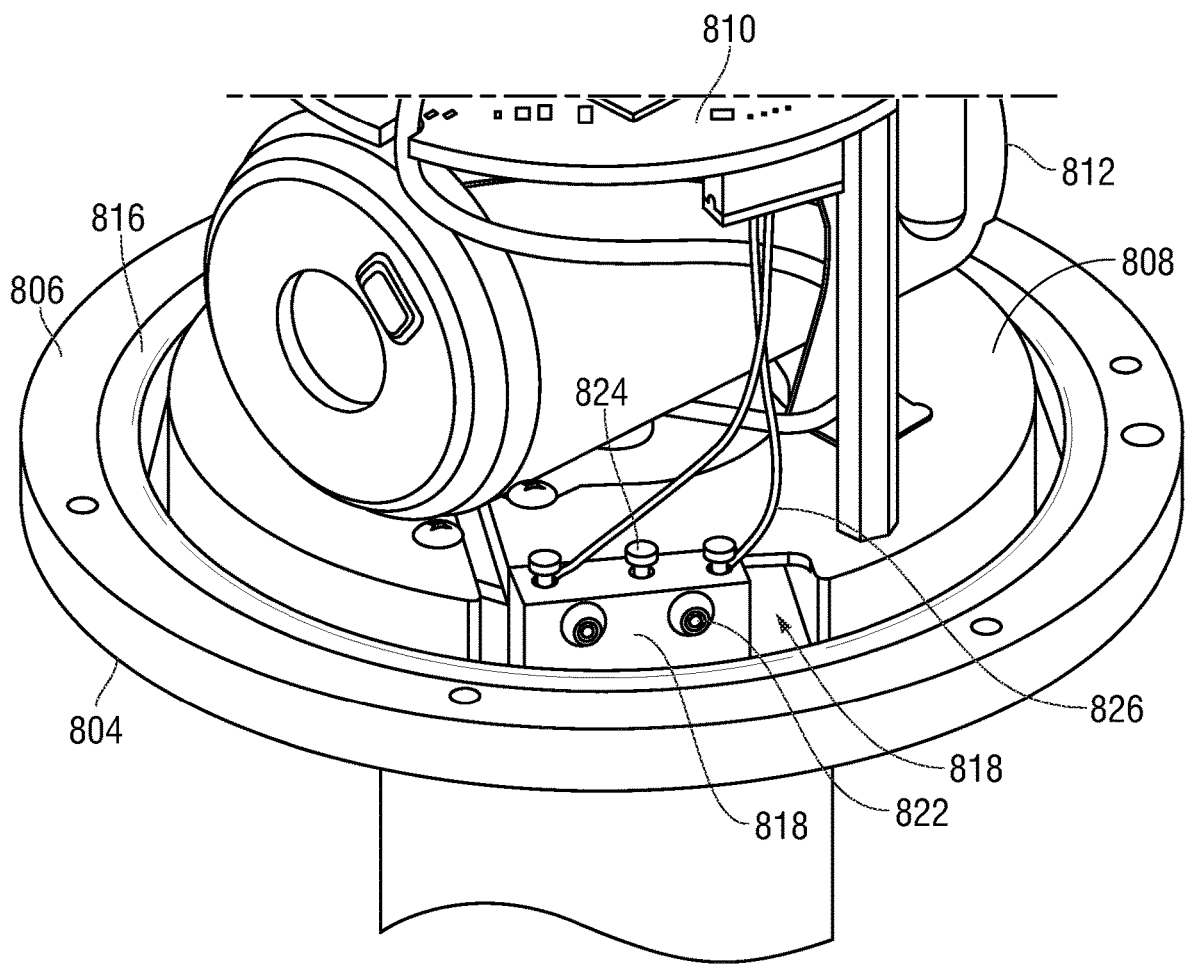
FIG. 9 shows an interior view of the exemplary housing of the network node according to embodiments of the present disclosure.

The electronics and other components can be seen in FIG. 9, which shows a partial view of the exemplary node from FIG. 8 with the cover 802 removed to expose the interior of the node. As this figure shows, the base plate 804 has a circumferential flange 806 to which the cover 802 may be fastened (e.g., screws, bolts, etc.) to enclose the electronics and other components of the node within the housing 800. The flange portion 806 surrounds a circular recessed area (not specifically labeled) on which a mounting platform 808 may be attached. The mounting platform 806 serves essentially as a carrier for the electronics and other components of the node, allowing them to be easily installed within the housing 800 simply by attaching the mounting platform 806 to the base plate 804. These electronics and components may include, for example, a node control circuit board 810 having programmable node control circuitry thereon (e.g., a microcontroller) that controls operation of the node, a power source 812 (e.g., a battery), and other components for the node. An O-ring 816 or similar sealing device may be disposed adjacent to the flange 806 to provide a liquid and gas tight seal when the cover 802 is fastened.

In accordance with embodiments of the present disclosure, a microswitch 818 may be mounted internally within the node to detect deflections in the base plate 804. In the FIG. 9 example, the microswitch 818 is positioned within a mounting slot 820 formed in the mounting platform 806. The mounting slot 820 may be formed by bending or folding down a portion of the mounting platform 806 in some embodiments to make room for the microswitch 818 on the base plate 804. The microswitch 818 may be any suitable commercially available microswitch 818, such as those available from Honeywell International, Inc. Screws 822 or other fastening means may be used to secure the microswitch 818 to the folded or bent down portion (see FIG. 11) of the mounting platform 806. The particular microswitch 818 shown here has a plurality of screw terminals 824 on top thereof to which wires 826 may be attached to electrically connect the microswitch to the circuit board 810 and the power source 812. Although only one microswitch 818 is shown in this example, those having ordinary skill in the art will appreciate that multiple microswitches 818 may be positioned at different locations around the base plate 804 as needed to achieve the desired level of deflection sensitivity.

In general operation, a user-provided force applied on the housing 800 causes a small yet sufficient deflection in the base plate 804 to actuate the microswitch 818. Upon being actuated, the microswitch 818 closes (or opens) the connection between the terminals 824 thereon, thereby providing an input current or voltage signal to the node control circuit board 810. Upon receiving the input signal, the node control circuit board 810 (or rather the programmable node control circuitry thereon) causes the node to initiate a predefined operation or operations. Examples include waking up the node, initiating a data transfer involving the node, connecting the node to a group or network of nodes, allowing other devices to connect to the node, turning on or flashing an LED in the node, and the like. A single user-provided force may suffice to initiate the node operation(s) in some embodiments, or multiple applications of force may be required in some embodiments, either in a particular sequence (e.g., two touches within one second) or a particular count (e.g., any two consecutive touches), to initiate the node operation(s). The threshold lightness of the touch or the threshold amount of force applied may also be adjusted as needed for a particular application.

Figure 10:
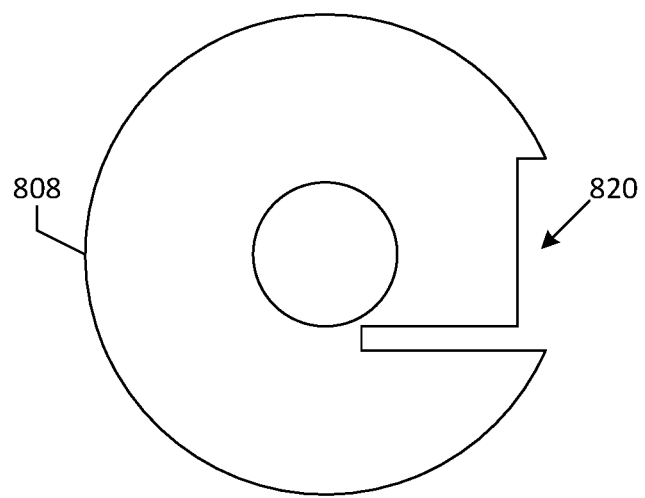
FIG. 10 shows a plan view of an exemplary mounting platform to which a microswitch may be mounted in the network node according to embodiments of the present disclosure.

FIG. 10 shows an overhead view of the mounting platform 808 with the mounting slot 820 formed therein according to some embodiments. In this example, the mounting slot 820 has a generally rectangular shape to accommodate the generally rectangular shape of the microswitch 818. Other types of shapes and arrangements may of course be used to accommodate other types of microswitches within the scope of the present disclosure. As mentioned above, the mounting slot 820 may be formed in some embodiments by removing and/or bending or folding down a portion of the mounting platform 806, and the microswitch 818 may be secured, for example, to the portion that is folded or bent down. The folded or bent down portion can be seen more clearly in FIG. 11.

Figure 11:
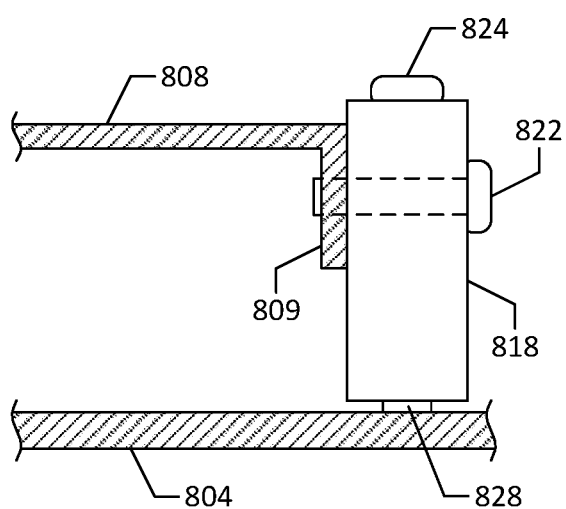
FIG. 11 shows a partial cross-sectional view of the network node with the microswitch mounted therein according to embodiments of the present disclosure.

FIG. 11 shows a partial cross-sectional view of the mounting platform 808 with the microswitch 818 attached. In this embodiment, the microswitch 818 is secured to a mounting tab 809 formed by the portion of the mounting platform 808 that was bent or folded down to help create the mounting slot 820 (see FIG. 10) where the microswitch 818 sits. Once in the mounting slot 820, one or more screws 822 can be used to secure the microswitch 818 to the mounting tab 809, as shown. Those skilled in the art will appreciate that other ways of securing the microswitch 818 to the mounting platform 808 may be used, such as an L-shaped bracket or a mounting arm, and the like.

Most microswitches like the microswitch 818 include a plunger 828 or similar element that, when depressed or otherwise actuated, closes (or opens) the microswitch. Care should be taken to ensure that the plunger 828 touches the base plate 804, but without being inadvertently actuated by the base plate 804, when securing the microswitch 818 to the mounting tab 809. In this way, the plunger 828 is actuated only when the base plate 804 deflects or bends enough to depress the plunger 828. It turns out, surprisingly, that a user-provided touch is enough to produce the necessary amount of deflection in the base plate 804 to depress the plunger 828. The specific amount of deflection or bending of the base plate 804 that will actuate the plunger 828 can be adjusted by appropriate selection and installation of the microswitch 818 as required by the particular application.

In some embodiments, hysteresis may be programmed into the node control circuitry on the node control circuit board 810 (see FIG. 9) to prevent inadvertent deflection detections. For example, the node control circuitry may require the microswitch 818 to be actuated for a predefined minimum amount of time before an input is recognized. If the microswitch connection is broken too quickly, the hysteresis allows the node control circuitry to ignore the input as a false input. The threshold amount of time may be selected as needed for the particular application. In some embodiments, instead of the microswitch 818, other suitably sensitive deflection detectors may also be used with the internal force sensor arrangement herein. One such deflection detector is a piezoelectric sensor, as depicted in FIG. 12.

Figure 12:
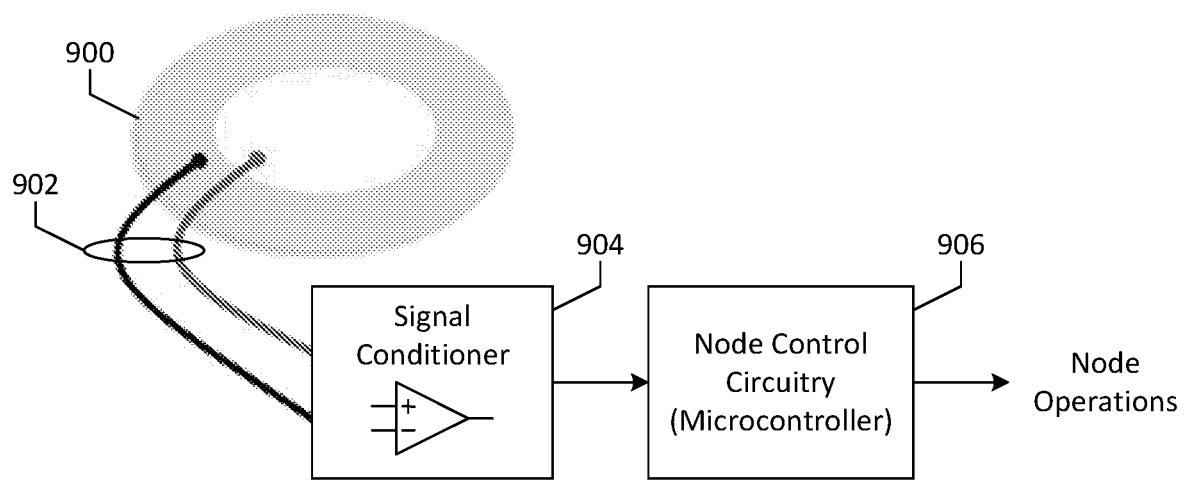
FIG. 12 shows a schematic diagram of an exemplary piezoelectric sensor that may be used in the network node according to embodiments of the present disclosure.

In FIG. 12, a schematic diagram is shown of an exemplary disc type piezoelectric sensor 900 that may be used in the internal force sensor within the housing 800. Other types of commercially available piezoelectric sensors may also be used provided they can be configured to detect deflection of the base plate 804. Examples include piezoelectric sensors from Kyocera Corporation, Solvay S.A., and others. Wire leads 902 are attached to the sensor 900 to carry the voltage to an external circuit, such as a signal conditioner circuit 904. The signal conditioner circuit 904 amplifies and cleans up (i.e., filters) the voltage and outputs a conditioned voltage signal to a node controller 906, such as the programmable node control circuitry on the circuit board 810 mentioned earlier (see FIG. 9). In some embodiments, the signal conditioner circuit 904 may also be on or part of the circuit board 810.

Unlike microswitches that simply complete an electrical connection, piezoelectric sensors produce a voltage proportional to the amount of stress/strain (deflection) experienced by the sensor. This allows the piezoelectric sensor 900 to output a different amplitude voltage signal depending on the amount of deflection of the base plate 804. Each different amplitude voltage signal can be processed as a distinct input by the node controller 906. That is, the node controller 906 can be programmed to recognize different levels of touches or different amounts of applied force based on the amplitude of the voltage signal received from the piezoelectric sensor 900. Thus, a light push can constitute one input that initiates one node operation(s), while a hard slap can constitute a different input that initiates a different node operation(s). And as with the microswitch 818, hysteresis may be implemented in the node controller 906 to minimize false or inadvertent inputs from the piezoelectric sensor 900.

Figure 13:
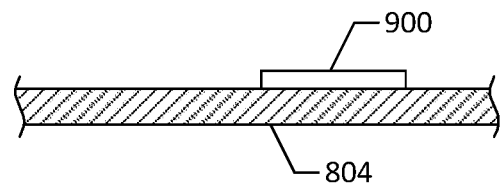
FIG. 13 shows a partial cross-sectional view of exemplary network node with a piezoelectric sensor therein according to embodiments of the present disclosure

FIG. 13 shows a partial cross-sectional view of the base plate 804 with the piezoelectric sensor 900 mounted thereto according to some embodiments. The electronics and other components of the node can be arranged in a manner similar to the embodiment shown in FIG. 11 and are thus omitted here for the sake of clarity. The piezoelectric sensor 900 may be mounted directly to the base plate 804 using a suitable bonding agent, such as an epoxy or the like to adhere the sensor 900 to the base plate 804. Unlike microswitches, the piezoelectric sensor 900 are directional, so a deflection along the sensor's primary axis produces a different voltage from a deflection perpendicular to the sensor's axis. Thus, in preferred embodiments, two piezoelectric sensors 900 may be mounted perpendicular to one another on the base plate 804 in order to provide greater directional coverage. Alternatively, multiple piezoelectric sensors 900 may be mounted at different angles to one another to provide even greater directional coverage.

Figure 14:
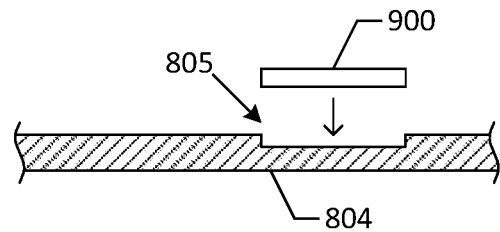
FIG. 14 shows an alternative network node with a piezoelectric sensor therein according to embodiments of the present disclosure.

FIG. 14 shows an alternative embodiment in which the piezoelectric sensor 900 is mounted within a pocket 805 in the base plate 804. The pocket 805 may be a thinned out section on the base plate 804 having a size and shape that conforms to the piezoelectric sensor 900. This pocket 805 may be formed using electrical discharge machining (EDM) or any other known techniques for removing material from the base plate 804. The thinned out section allows that part of the base plate 804 to deflect to a greater degree, thereby imparting greater stress/strain on the piezoelectric sensor 900. An epoxy or other bonding agent may again be used to adhere the sensor 900 to the base plate 804 within the pocket 805. As with the embodiment of FIG. 13, multiple piezoelectric sensors 900 can be mounted at different angles to one another on the base plate 804 to provide greater directional coverage.

Thus far, several implementations of a wireless instrument area network node having an internal force sensor arrangement have been described. Those having ordinary skill in the art will understand that numerous variations and modifications to such implementations are available within the scope of the disclosed embodiments. Following is a description of a method that may be used by or with a wireless instrument area network node having an internal force sensor arrangement according to embodiments of the present disclosure.

Figure 15:
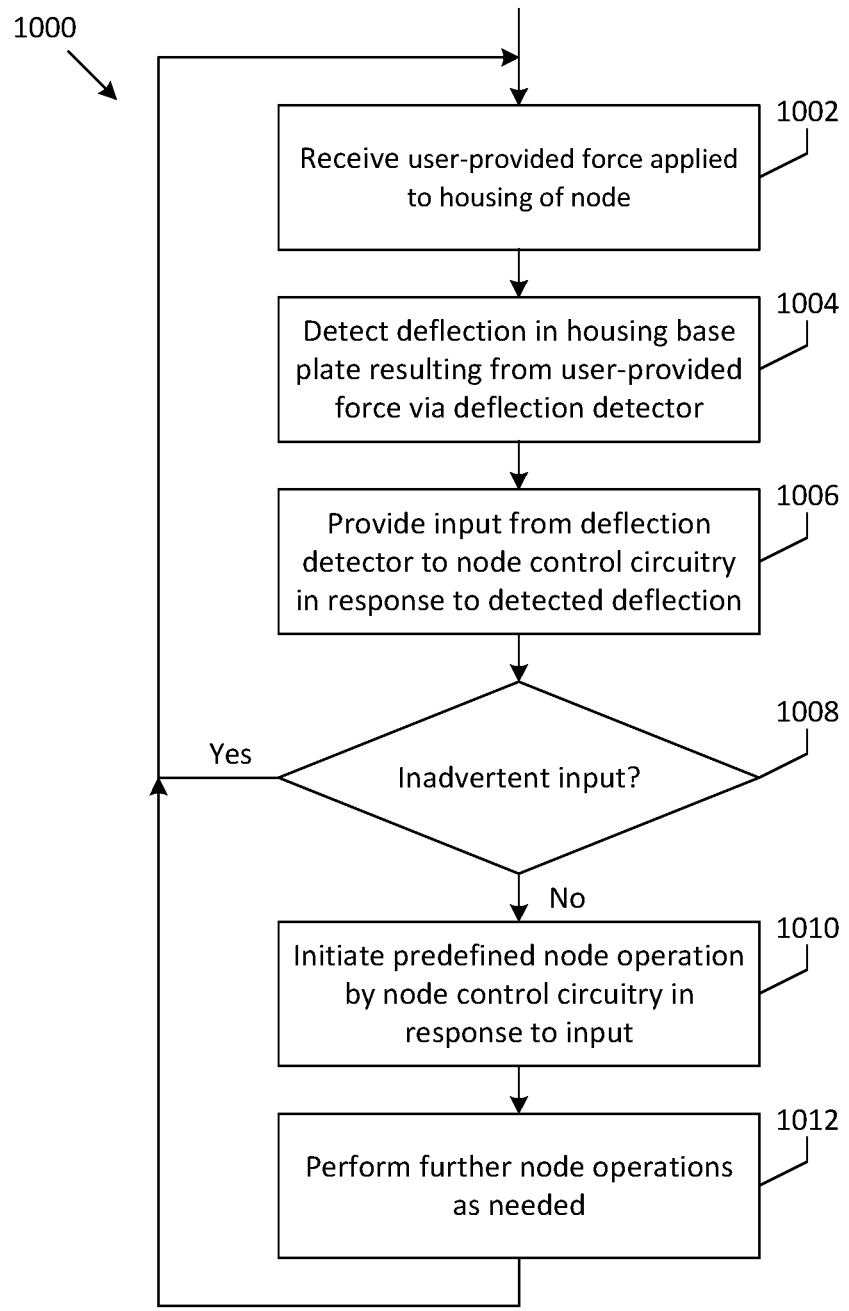
FIG. 15 shows an flow diagram of a method that may be used by or with a network node according to embodiments of the present disclosure.

Referring to FIG. 15, a flow diagram is shown for a method 1000 that may be used by or with a wireless instrument area network node according to embodiments of the present disclosure. The method generally begins at 1002, where a user-provided force is received at the network node, for example, by the user touching, tapping, or otherwise applying force to a housing of the node. This force, even a small amount, can be sufficient to cause a base plate of the housing to flex, bend, or otherwise deflect. At 1004, a deflection detector on the base plate within the housing detects the deflection resulting from the user-provided force. A number of deflection detectors are available that can detect this deflection and other extremely small base plate deflections, even on a base plate made of metal, such as 316L stainless steel. Examples of deflection deflectors include microswitches, piezoelectric sensors, and similar force transducers.

At 1006, the deflection detector produces an input in response to the detection of the base plate deflection, and the input is provided to node control circuitry within the housing of the node. The input may be a voltage signal or a current signal depending on the deflection detector and type of signal conditioning circuitry used therefor. Where the deflection detector is a piezoelectric deflection detector, the input signal therefrom may have different signal amplitudes according to the amount of user-provided force applied to the node housing. In that case, the node control circuitry may process distinct signals from the piezoelectric deflection detector as distinct inputs.

At 1008, in some embodiments, the node control circuitry determines whether the input may have been a false or inadvertent input. In some embodiments, this may involve checking to see whether the input has a certain minimum or threshold duration. If the determination is yes, meaning the input was inadvertent, then the method returns to 1002 and awaits another user-provided force. If the determination is no, meaning the input was not inadvertent, then the node control circuitry initiates a predefined node operation or operations in response to the input. Examples of node operations may include waking up the node from a sleep mode, initiating a data transfer to or from the node, connecting the node to a group or network of nodes, allowing other devices to connect to the node, turning on or flashing an LED in the node, and the like.

At 1012, the node control circuitry performs any further node operations that may have been programmed therein, as needed. Thereafter, the method returns to 1002 to await further user-provided forces.

As described above and as will be appreciated by those of ordinary skill in the art, embodiments of the disclosure herein may be configured as a system, method, or combination thereof. Accordingly, embodiments of the present disclosure may be comprised of various means including hardware, software, firmware or any combination thereof.

It is to be appreciated that the concepts, systems, circuits and techniques sought to be protected herein are not limited to use in the example applications described herein (e.g., industrial applications) but rather, may be useful in substantially any application where it is desired to automatically collect and analyze data from device or equipment.

Having described preferred embodiments, which serve to illustrate various concepts, structures and techniques that are the subject of this patent, it will now become apparent to those of ordinary skill in the art that other embodiments incorporating these concepts, structures and techniques may be used. Additionally, elements of different embodiments described herein may be combined to form other embodiments not specifically set forth above Accordingly, it is submitted that that scope of the patent should not be limited to the described embodiments but rather should be limited only by the spirit and scope of the following claims.

What is claimed is:

1. A wireless instrument area network node, comprising:
a cover;
a base plate fastened to the cover, the base plate and the cover forming a housing for the node;
node control circuitry disposed within the housing, the node control circuitry operable to control operation of the node; and
a deflection detector mounted on the base plate within the housing, the deflection detector configured to provide an input to the node control circuitry in response to a user-provided force being applied to the housing;
wherein the node performs a predefined node operation in response to the node control circuitry receiving an input from the deflection detector, the predefined node operation including wirelessly connecting the node to a group of nodes.

2. The wireless instrument area network node of claim 1, wherein the predefined node operation includes one or more of: waking up the node from a sleep mode, initiating a data transfer to or from the node, allowing other devices to connect to the node, and turning on or flashing an LED in the node.

3. The wireless instrument area network node of claim 1, wherein the node control circuitry is further operable to apply hysteresis to the input received from the deflection detector to minimize inadvertent inputs from the deflection detector.

4. The wireless instrument area network node of claim 1, wherein the user-provided force includes a hand touch.

5. The wireless instrument area network node of claim 1, wherein the base plate is made of a stainless steel material.

6. The wireless instrument area network node of claim 1, wherein the deflection detector is a microswitch detection deflector.

7. The wireless instrument area network node of claim 6, further comprising a mounting platform attached to the base plate, wherein the microswitch detection deflector is secured to the mounting platform.

8. The wireless instrument area network node of claim 7, wherein the mounting platform has a mounting slot formed therein having a size and shape to receive the microswitch detection deflector.

9. The wireless instrument area network node of claim 1, wherein the deflection detector is a piezoelectric detection deflector.

10. The wireless instrument area network node of claim 9, wherein the node control circuitry causes the node to initiate a different predefined node operation according to an amplitude of an input received from the piezoelectric detection deflector.

11. A method of operating a wireless instrument area network node, comprising:
receiving a user-provided force applied to a housing of the node, the housing comprising a cover fastened to a base plate, the base plate and the cover forming an enclosure for the node;
detecting a deflection in the base plate resulting from the user-provided force, the deflection in the base plate being detected by a deflection detector on the base plate within the housing;
providing an input from the deflection detector to node control circuitry within the housing in response to detection of the deflection in base plate by the deflection detector, the node control circuitry operable to control operation of the node; and performing a predefined node operation in the node in response to the node control circuitry receiving an input from the deflection detector, the predefined node operation including wirelessly connecting the node to a group of nodes.

12. The method of claim 11, wherein initiating a predefined node operation comprises initiating one or more of: waking up the node from a sleep mode, initiating a data transfer to or from the node, allowing other devices to connect to the node, and turning on or flashing an LED in the node.

13. The method of claim 11, further comprising checking whether the input received from the deflection detector is an inadvertent input, the checking being performed by the node control circuitry.

14. The method of claim 11, wherein receiving a user-provided force includes receiving a hand touch to the housing of the node.

15. The method of claim 11, wherein detecting a deflection in the base plate comprises detecting deflection in a stainless steel base plate.

16. The method of claim 11, wherein the deflection in the base plate is detected by a microswitch deflection detector.

17. The method of claim 16, further comprising securing the microswitch deflection detector to a mounting platform attached to the base plate.

18. The method of claim 17, wherein securing the microswitch deflection detector to the mounting platform comprises securing the microswitch deflection detector in a mounting slot formed in the mounting platform, the mounting slot having a size and shape to receive the microswitch deflection detector.

19. The method of claim 11, wherein the deflection in the base plate is detected by a piezoelectric deflection detector.

20. The method of claim 19, further comprising initiating a different predefined node operation in the node according to an amplitude of an input received by the node control circuitry from the piezoelectric deflection detector.

* * * * *